United States Patent
Crisp et al.

(10) Patent No.: US 8,759,982 B2
(45) Date of Patent: Jun. 24, 2014

(54) DESKEWED MULTI-DIE PACKAGES

(71) Applicant: Tessera, Inc., San Jose, CA (US)

(72) Inventors: Richard Dewitt Crisp, Hornitos, CA (US); Belgacem Haba, Saratoga, CA (US); Wael Zohni, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/950,912

(22) Filed: Jul. 25, 2013

(65) Prior Publication Data

US 2013/0307138 A1    Nov. 21, 2013

Related U.S. Application Data

(63) Continuation of application No. 13/306,068, filed on Nov. 29, 2011, now Pat. No. 8,502,390.

(60) Provisional application No. 61/506,889, filed on Jul. 12, 2011.

(51) Int. Cl.
*H01L 23/52*    (2006.01)

(52) U.S. Cl.
USPC .......................................... 257/774; 257/723

(58) Field of Classification Search
USPC .................... 257/692, 723, 774, 778; 29/831; 395/292
See application file for complete search history.

(56) References Cited

U.S. PATENT DOCUMENTS

| | | |
|---|---|---|
| 3,670,208 A | 6/1972 | Hovnanian et al. |
| 5,148,265 A | 9/1992 | Khandros et al. |
| 5,148,266 A | 9/1992 | Khandros et al. |
| 5,480,840 A | 1/1996 | Barnes et al. |
| 5,679,977 A | 10/1997 | Khandros et al. |
| 5,777,391 A | 7/1998 | Nakamura et al. |
| 5,821,614 A | 10/1998 | Hashimoto et al. |
| 5,929,517 A | 7/1999 | Distefano et al. |
| 5,936,305 A | 8/1999 | Akram |

(Continued)

FOREIGN PATENT DOCUMENTS

| EP | 1205977 A2 | 5/2002 |
|---|---|---|
| JP | 2002-076252 A | 3/2002 |

(Continued)

OTHER PUBLICATIONS

Kang, et al., 8Gb 3D DDR3 DRAM Using Through-Silicon-Via Technology, IEEE, International Solid-State Circuits Conference, 2009, Samsung Electronics, Hwasung, Korea.

(Continued)

*Primary Examiner* — Roy Potter
(74) *Attorney, Agent, or Firm* — Lerner, David, Littenberg, Krumholz & Mentlik, LLP

(57) ABSTRACT

A microelectronic package may have a plurality of terminals disposed at a face thereof which are configured for connection to at least one external component. e.g., a circuit panel. First and second microelectronic elements can be affixed with packaging structure therein. A first electrical connection can extend from a respective terminal of the package to a corresponding contact on the first microelectronic element, and a second electrical connection can extend from the respective terminal to a corresponding contact on the second microelectronic element, the first and second connections being configured such that a respective signal carried by the first and second connections in each group is subject to propagation delay of the same duration between the respective terminal and each of the corresponding contacts coupled thereto.

20 Claims, 21 Drawing Sheets

(56) References Cited

U.S. PATENT DOCUMENTS

| | | |
|---|---|---|
| 5,973,403 A | 10/1999 | Wark |
| 6,086,386 A | 7/2000 | Fjelstad et al. |
| 6,130,116 A | 10/2000 | Smith et al. |
| 6,197,665 B1 | 3/2001 | DiStefano et al. |
| 6,252,264 B1 | 6/2001 | Bailey et al. |
| 6,255,899 B1 | 7/2001 | Bertin et al. |
| 6,261,867 B1 | 7/2001 | Robichaud et al. |
| 6,297,960 B1 | 10/2001 | Moden et al. |
| 6,323,436 B1 | 11/2001 | Hedrick et al. |
| 6,343,019 B1 | 1/2002 | Jiang et al. |
| 6,376,769 B1 | 4/2002 | Chung |
| 6,380,318 B1 | 4/2002 | Saito et al. |
| 6,384,473 B1 | 5/2002 | Peterson et al. |
| 6,426,560 B1 | 7/2002 | Kawamura et al. |
| 6,433,422 B1 | 8/2002 | Yamasaki |
| 6,445,594 B1 | 9/2002 | Nakagawa et al. |
| 6,452,266 B1 | 9/2002 | Iwaya et al. |
| 6,462,423 B1 | 10/2002 | Akram et al. |
| 6,577,004 B1 | 6/2003 | Rumsey et al. |
| 6,617,695 B1 | 9/2003 | Kasatani |
| 6,619,973 B2 | 9/2003 | Perino et al. |
| 6,620,648 B2 | 9/2003 | Yang |
| 6,633,078 B2 | 10/2003 | Hamaguchi et al. |
| 6,661,089 B2 | 12/2003 | Huang |
| 6,692,987 B2 | 2/2004 | Lim et al. |
| 6,707,141 B2 | 3/2004 | Akram |
| 6,720,666 B2 | 4/2004 | Lim et al. |
| 6,742,098 B1 | 5/2004 | Halbert et al. |
| 6,744,137 B2 | 6/2004 | Kinsman |
| 6,765,288 B2 | 7/2004 | Damberg |
| 6,781,220 B2 | 8/2004 | Taube et al. |
| 6,821,815 B2 | 11/2004 | Smith et al. |
| 6,836,007 B2 | 12/2004 | Michii et al. |
| 6,876,088 B2 | 4/2005 | Harvey |
| 6,894,379 B2 | 5/2005 | Feurle |
| 6,894,381 B2 | 5/2005 | Hetzel et al. |
| 6,906,415 B2 | 6/2005 | Jiang et al. |
| 6,943,057 B1 | 9/2005 | Shim et al. |
| 6,982,485 B1 | 1/2006 | Lee et al. |
| 7,061,092 B2 | 6/2006 | Akram et al. |
| 7,061,105 B2 | 6/2006 | Masuda et al. |
| 7,061,121 B2 | 6/2006 | Haba |
| 7,091,064 B2 | 8/2006 | Jiang |
| 7,138,709 B2 | 11/2006 | Kumamoto |
| 7,145,226 B2 | 12/2006 | Kumamoto |
| 7,151,319 B2 | 12/2006 | Iida et al. |
| 7,170,158 B2 | 1/2007 | Choi et al. |
| 7,262,507 B2 | 8/2007 | Hino et al. |
| 7,272,888 B2 | 9/2007 | DiStefano |
| 7,324,352 B2 | 1/2008 | Goodwin |
| 7,368,319 B2 | 5/2008 | Ha et al. |
| 7,372,169 B2 | 5/2008 | Chang |
| 7,389,937 B2 | 6/2008 | Ito |
| 7,405,471 B2 | 7/2008 | Kledzik et al. |
| 7,414,312 B2 | 8/2008 | Nguyen et al. |
| 7,476,975 B2 | 1/2009 | Ogata |
| 7,518,226 B2 | 4/2009 | Cablao et al. |
| 7,535,110 B2 | 5/2009 | Wu et al. |
| 7,550,842 B2 | 6/2009 | Khandros et al. |
| 7,589,409 B2 | 9/2009 | Gibson et al. |
| 7,633,146 B2 | 12/2009 | Masuda et al. |
| 7,633,147 B2 | 12/2009 | Funaba et al. |
| 7,642,635 B2 | 1/2010 | Kikuchi et al. |
| 7,692,931 B2 | 4/2010 | Chong et al. |
| 7,763,964 B2 | 7/2010 | Matsushima |
| 7,763,969 B2 | 7/2010 | Zeng et al. |
| RE41,478 E | 8/2010 | Nakamura et al. |
| RE41,721 E | 9/2010 | Nakamura et al. |
| RE41,722 E | 9/2010 | Nakamura et al. |
| 7,795,721 B2 | 9/2010 | Kurita |
| RE41,972 E | 11/2010 | Lenander et al. |
| 7,989,940 B2 | 8/2011 | Haba et al. |
| RE42,972 E | 11/2011 | Nakamura et al. |
| 8,502,390 B2 * | 8/2013 | Crisp et al. .................. 257/774 |
| 2001/0002727 A1 | 6/2001 | Shiraishi et al. |
| 2001/0022740 A1 | 9/2001 | Nuxoll et al. |
| 2002/0000583 A1 | 1/2002 | Kitsukawa et al. |
| 2002/0027019 A1 | 3/2002 | Hashimoto |
| 2002/0030261 A1 | 3/2002 | Rolda et al. |
| 2002/0053727 A1 | 5/2002 | Kimura |
| 2002/0053732 A1 | 5/2002 | Iwaya et al. |
| 2002/0066950 A1 | 6/2002 | Joshi |
| 2002/0171142 A1 | 11/2002 | Kinsman |
| 2003/0064547 A1 | 4/2003 | Akram et al. |
| 2003/0089978 A1 | 5/2003 | Miyamoto et al. |
| 2003/0089982 A1 | 5/2003 | Feurle |
| 2003/0107908 A1 | 6/2003 | Jang et al. |
| 2003/0205801 A1 | 11/2003 | Baik et al. |
| 2003/0211660 A1 | 11/2003 | Lim et al. |
| 2004/0016999 A1 | 1/2004 | Misumi |
| 2004/0061211 A1 | 4/2004 | Michii et al. |
| 2004/0061577 A1 | 4/2004 | Breisch et al. |
| 2004/0090756 A1 | 5/2004 | Ho et al. |
| 2004/0112088 A1 | 6/2004 | Ueda et al. |
| 2004/0145042 A1 | 7/2004 | Morita et al. |
| 2004/0164382 A1 | 8/2004 | Gerber et al. |
| 2004/0184240 A1 | 9/2004 | Su |
| 2005/0116358 A1 | 6/2005 | Haba |
| 2005/0194672 A1 | 9/2005 | Gibson et al. |
| 2005/0206585 A1 | 9/2005 | Stewart et al. |
| 2005/0258532 A1 | 11/2005 | Yoshikawa et al. |
| 2006/0004981 A1 | 1/2006 | Bains |
| 2006/0081983 A1 | 4/2006 | Humpston et al. |
| 2006/0207788 A1 | 9/2006 | Yoon et al. |
| 2006/0290005 A1 | 12/2006 | Thomas et al. |
| 2007/0025131 A1 | 2/2007 | Ruckerbauer et al. |
| 2007/0108592 A1 | 5/2007 | Lai et al. |
| 2007/0120245 A1 | 5/2007 | Yoshikawa et al. |
| 2007/0143553 A1 | 6/2007 | LaBerge |
| 2007/0187836 A1 | 8/2007 | Lyne |
| 2007/0241441 A1 | 10/2007 | Choi et al. |
| 2008/0012110 A1 | 1/2008 | Chong et al. |
| 2008/0061423 A1 | 3/2008 | Brox et al. |
| 2008/0088033 A1 | 4/2008 | Humpston et al. |
| 2008/0098277 A1 | 4/2008 | Hazelzet |
| 2008/0150155 A1 | 6/2008 | Periaman et al. |
| 2008/0182443 A1 | 7/2008 | Beaman et al. |
| 2008/0185705 A1 | 8/2008 | Osborn et al. |
| 2008/0230888 A1 | 9/2008 | Sasaki |
| 2008/0265397 A1 | 10/2008 | Lin et al. |
| 2009/0065948 A1 | 3/2009 | Wang |
| 2009/0108425 A1 | 4/2009 | Lee et al. |
| 2009/0200680 A1 | 8/2009 | Shinohara et al. |
| 2009/0250255 A1 | 10/2009 | Shilling et al. |
| 2009/0250822 A1 | 10/2009 | Chen et al. |
| 2009/0294938 A1 | 12/2009 | Chen |
| 2009/0314538 A1 | 12/2009 | Jomaa et al. |
| 2010/0052111 A1 | 3/2010 | Urakawa |
| 2010/0102428 A1 | 4/2010 | Lee et al. |
| 2010/0182040 A1 | 7/2010 | Feng et al. |
| 2010/0244272 A1 | 9/2010 | Lee et al. |
| 2010/0244278 A1 | 9/2010 | Shen |
| 2010/0295166 A1 | 11/2010 | Kim |
| 2010/0301466 A1 | 12/2010 | Taoka et al. |
| 2010/0327457 A1 | 12/2010 | Mabuchi |
| 2011/0042824 A1 | 2/2011 | Koide |
| 2011/0193178 A1 | 8/2011 | Chang et al. |
| 2011/0193226 A1 | 8/2011 | Kirby et al. |
| 2011/0254156 A1 | 10/2011 | Lin |
| 2012/0018863 A1 | 1/2012 | Oganesian et al. |
| 2012/0020026 A1 | 1/2012 | Oganesian et al. |

FOREIGN PATENT DOCUMENTS

| | | |
|---|---|---|
| JP | 2004-063767 A | 2/2004 |
| JP | 2008-198841 A | 8/2008 |
| JP | 3143893 U | 8/2008 |
| JP | 2010-098098 A | 4/2010 |
| KR | 2001-0002214 A | 1/2001 |
| KR | 2005-0119414 A | 12/2005 |
| KR | 2006-0120365 A | 11/2006 |
| KR | 2007-0088177 A | 8/2007 |
| KR | 2009-0008341 A | 1/2009 |

(56) References Cited

FOREIGN PATENT DOCUMENTS

| KR | 2009-0086314 A | 8/2009 |
|---|---|---|
| TW | M338433 U | 8/2008 |
| WO | 2010120310 A1 | 10/2010 |

OTHER PUBLICATIONS

U.S. Appl. No. 13/306,300, filed Nov. 29, 2011.
U.S. Appl. No. 13/346,201, filed Jan. 9, 2012.
U.S. Appl. No. 13/080,876, filed Apr. 6, 2011.
U.S. Appl. No. 13/337,565, filed Dec. 27, 2011.
U.S. Appl. No. 13/440,313, filed Apr. 5, 2012.
U.S. Appl. No. 13/439,317, filed Apr. 5, 2012.
U.S. Appl. No. 13/439,286, filed Apr. 5, 2012.
U.S. Appl. No. 13/354,772, filed Jan. 20, 2012.
Kang, et al., 8Gb 3D DDR3 DRAM Using Through-Silicon-Via Technology, IEEE, International Solid-State Circuits Conference, 2009, pp. 130-132.
U.S. Appl. No. 13/337,575, filed Dec. 27, 2011.
Sandforce, "SF-2200 & SF-2100 Client SSD Processors", 2011.
U.S. Appl. No. 13/439,299, filed Apr. 4, 2012.
U.S. Appl. No. 13/439,354, filed Apr. 4, 2012.
Elpida User's Manual, "Introduction to GDDR5 SGRAM", Document No. E1600E10 (Ver. 1.0), Published Mar. 2010, Japan, URL: http:$^T$www.elpida.com.
Hynix, "2GB (64M×32) GDDR5 SGRAM HRGQ2H24AFR", Nov. 2011-Feb. 2012.
Partial International Search Report dated Oct. 26, 2012 in International Patent Appl. No. PCT/US2012/046049.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
US Non Final Office Action dated Oct. 18, 2012 for U.S. Appl. No. 13/439,299.
International Search Report and Written Opinion for Application No. PCT/US2012/046049 dated Jan. 10, 2013.
International Search Report and Written Opinion for Application No. PCT/US2012/046049 dated Nov. 29, 2012.
US Amendment for U.S. Appl. No. 13/439,299 dated Jan. 18, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/057170 dated Jan. 31, 2013.
Partial Search Report for Application No. PCT/US2012/000425 dated Jan. 30, 2013.
Partial Search Report for Application No. PCT/US2012/058557 dated Feb. 4, 2013.

* cited by examiner

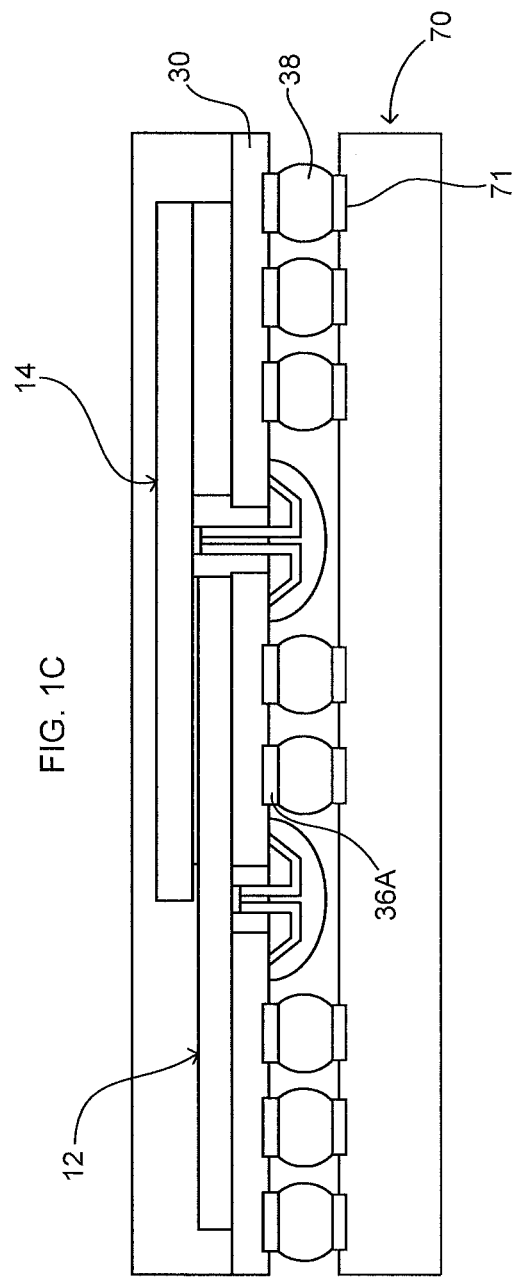

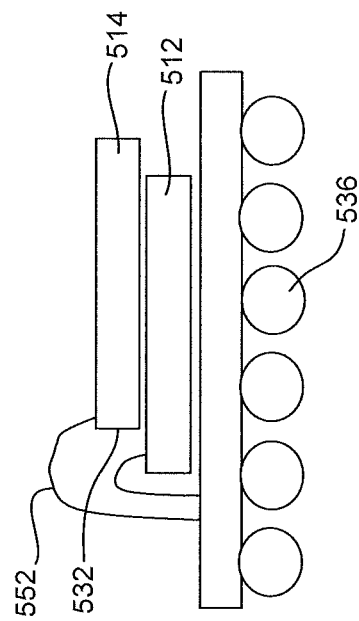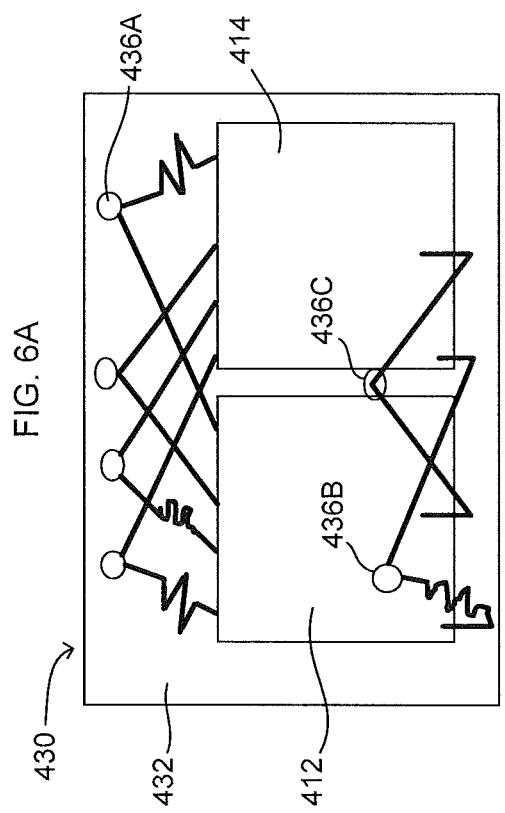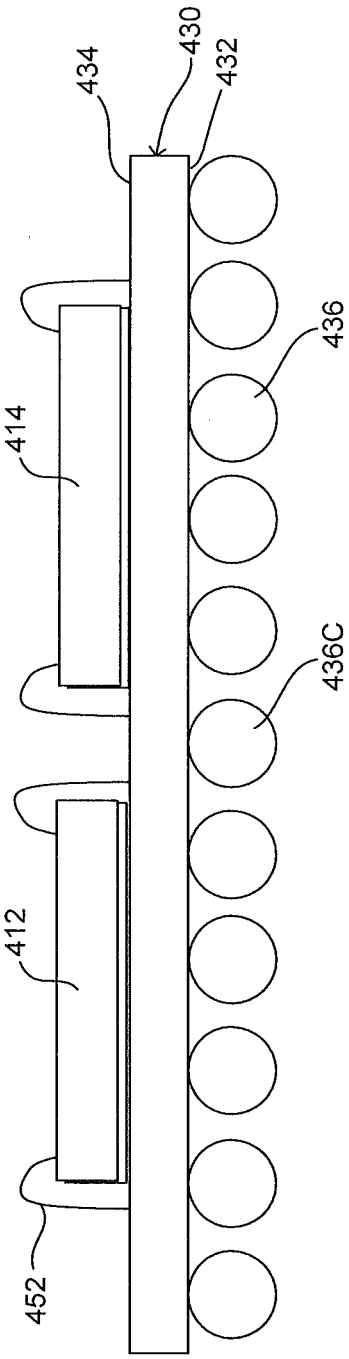

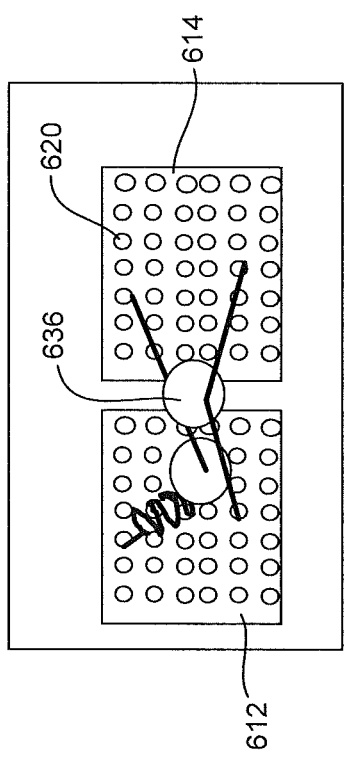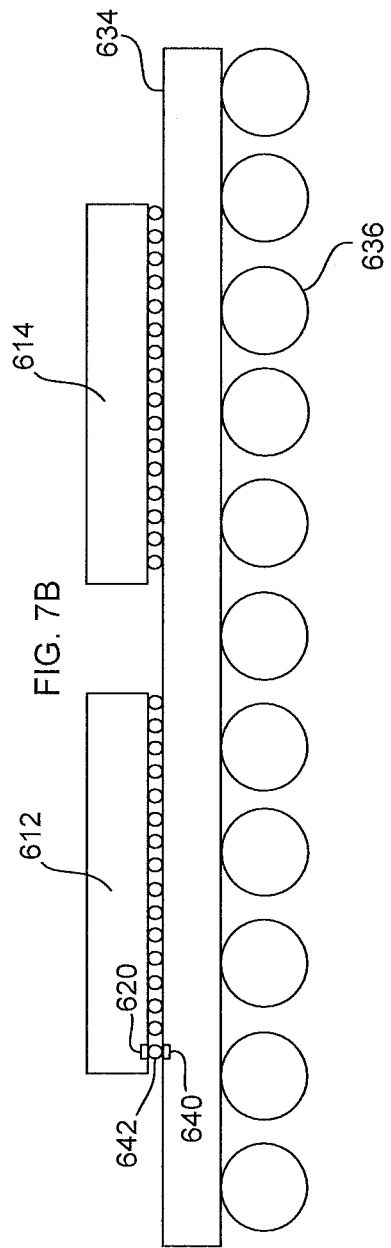

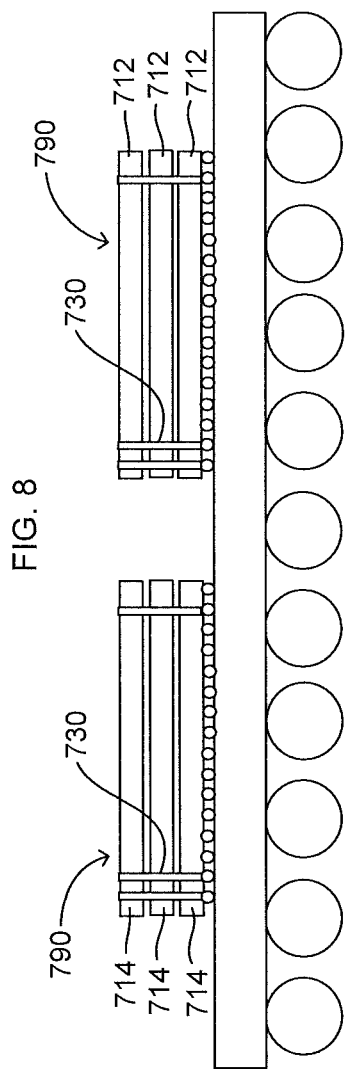

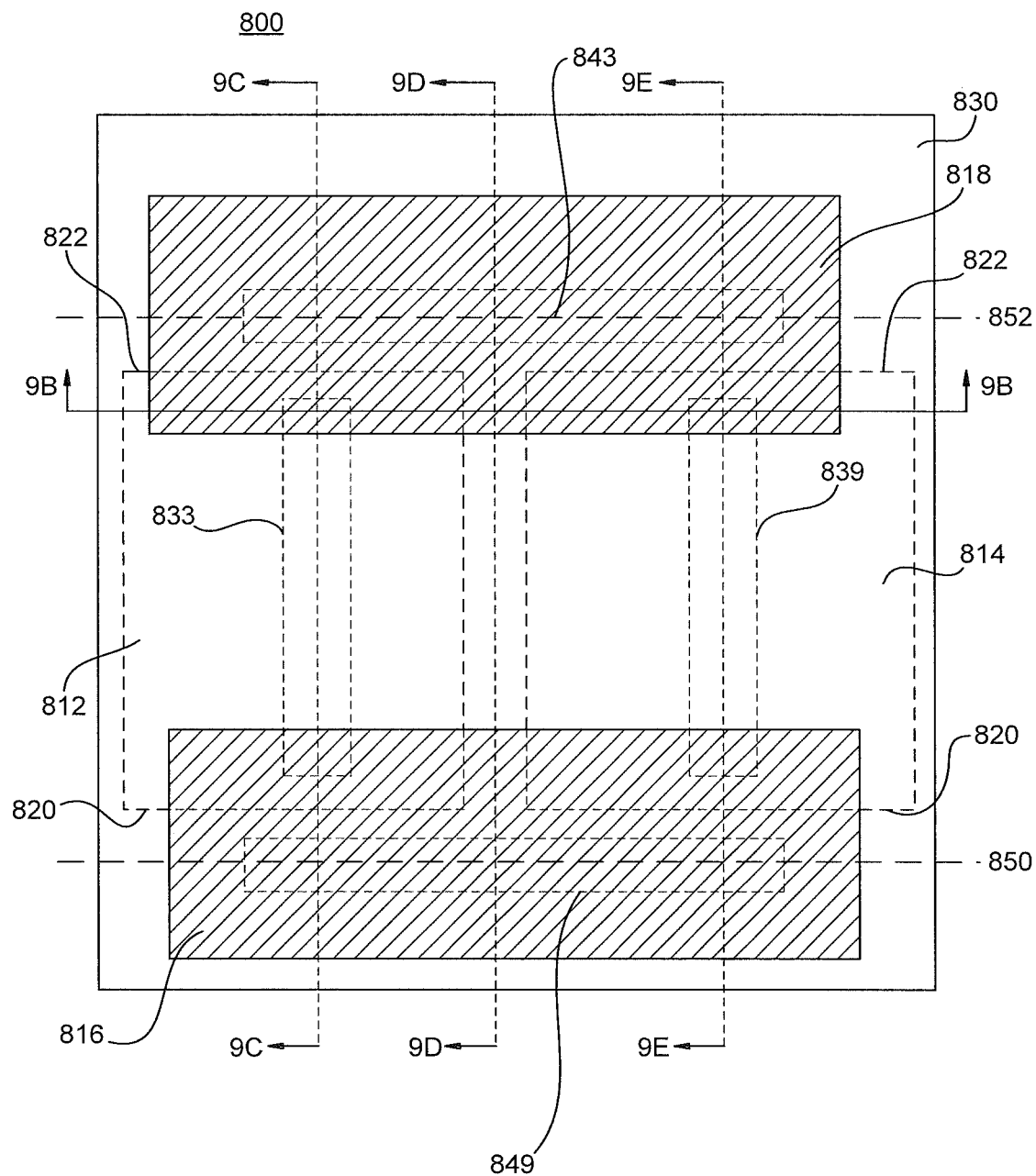

DESKEWED MULTI-DIE PACKAGES

CROSS-REFERENCE TO RELATED APPLICATION

The present application is a continuation of U.S. patent application Ser. No. 13/306,068, filed Nov. 29, 2011, which application claims the benefit of the filing date of U.S. Provisional Application 61/506,889 filed Jul. 12, 2011, the disclosures of which are hereby incorporated herein by reference.

BACKGROUND OF THE INVENTION

The present invention relates to microelectronic packages or assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In "flip chip" designs, the front face of the chip confronts the face of a package substrate, i.e., chip carrier and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Packages and assemblies containing multiple chips are common for packaging chips that contain memory storage arrays, particularly for dynamic random access memory chips (DRAMs) and flash memory chips. Each package has many electrical connections for carrying signals, power and ground between terminals, i.e., external connection points of the package, and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extending in both horizontal and vertical directions relative to the surface of the chip.

The transmission of signals within packages to chips of multi-chip packages poses particular challenges, especially for signals common to two or more chips in the package such as clock signals, and address and strobe signals for memory chips. Within such multi-chip packages, the lengths of the connection paths between the terminals of the package and the chips can vary. The different path lengths can cause the signals to take longer or shorter times to travel between the terminals and each chip.

Travel time of a signal from one point to another is called "propagation delay" and is a function of the conductor length, the conductor's structure, i.e., width, and other dielectric or conductive structure in close proximity therewith.

Differences in the times at which a particular signal arrives at different locations is called "skew". Differences in the times at which two different signals reach a particular location can also be called "skew". The skew in the arrival times of a particular signal at two or more locations is a result of both propagation delay and the times at which the particular signal starts to travel towards the locations. Skew may or may not impact circuit performance. Skew often has little impact on performance when all signals in a synchronous group of signals are skewed together, in which case all signals needed for operation arrive together when needed. However, this is not the case when different signals of a group of synchronous signals needed for operation arrive at different times. In this case the skew impacts performance because the operation cannot be performed unless all needed signals have arrived.

FIG. 1 illustrates an example of signal skew and its potential impact on performance. FIG. 1 is a graph illustrating transitions in signals Addr0, Addr1, and Addr2 needed for operation by each of a plurality of memory chips, e.g., DRAM chips within a package or module. As depicted in FIG. 1, due to different propagation delays, the Addr signals arrive at the DRAM chips at different times. Thus, Addr0 transitions between low and high signal levels (or between high and low signal levels) before Addr1 transitions between signal levels. Likewise, Addr1 transitions between signal levels before Addr2 transitions between signal levels.

The problem with synchronous signals from the package arriving at the contacts of a chip at different times is that this limits the speed or frequency at which the chip can transmit or receive the signals. To function properly, all synchronous signals required for an operation need to have arrived before the operation can be performed. A consequence of synchronous signals arriving at different times is that the frequency used to clock the signals into the chip may have to decrease.

FIG. 1 further illustrates two intervals based on different arrival times of the signals involved. The first interval is set up time 102 based on the interval between the latest arriving signal and the sampling clock transition labeled CK in FIG. 1. The second interval is hold time 104 which is based on the interval between the sampling clock transition CK and the earliest arriving signal in the next successive clock cycle of operation. The time at which the signals are latched into the chip within the package is indicated by "CK". For best performance per a given clock frequency it is desirable to maximize both the setup time and hold time.

In light of the background described above, further improvements can be made to multi-chip packages and assemblies to address skew.

SUMMARY OF THE INVENTION

A microelectronic package according to an aspect of the invention includes packaging structure having a plurality of terminals disposed at a face thereof, the terminals being configured for connecting the microelectronic package to at least one component external to the package. First and second microelectronic elements can be affixed with the packaging structure. The package includes connections electrically coupling the terminals of the package with the first and second microelectronic elements. The connections can include groups of connections for carrying respective signals, each group including two or more connections, e.g., a first connection extending from a respective terminal of the package to a corresponding contact on the first microelectronic element and a second connection extending from the respective terminal to a corresponding contact on the second microelectronic element. The first and second connections can be configured such that a respective signal carried by the first and second connections in each group is subject to propagation delay of the same duration between the respective terminal and each of the corresponding contacts coupled thereto.

In accordance with a particular aspect of the invention, a difference between the total electrical lengths of the connections in a respective group of the connections can be not greater than 10 per cent, even when distances along straight lines between the terminal and the respective contacts coupled by such group of connections varies by greater than 10 per cent.

In accordance with an aspect of the invention, the matched delay may result at least partly from differences in a spacing of conductors in the electrical connections relative to other conductive structure of the substrate.

In accordance with an aspect of the invention, a microelectronic package may further include a circuit panel having circuit contacts, wherein the terminals of the package are electrically connected to the circuit contacts.

In accordance with a particular aspect of the invention, at least one of the signals may be a clock signal or a command signal.

In accordance with a particular aspect of the invention, the signals may include a plurality of address signals and a sampling signal used to sample the address signals.

In accordance with a particular aspect of the invention, the signals may further include a command strobe signal.

In accordance with a particular aspect of the invention, the same duration of the propagation delay of the respective signal on the first and second connections within each group may be within a tolerance of ten per cent of the cycle time of that signal.

In accordance with a particular aspect of the invention, a third microelectronic element may be affixed with the packaging structure, wherein at least one of the groups of connections includes a third connection electrically coupling the respective terminal to a corresponding contact of the third microelectronic element for carrying the respective signal thereto, wherein the signal carried by the first, second and third connections is subject to propagation delay of the same duration between the respective terminal and each of the corresponding contacts coupled thereto. In a particular example, a fourth microelectronic element may also affixed with the packaging structure, wherein at least one of the groups of connections includes a fourth connection electrically coupling the respective terminal to a corresponding contact of the fourth microelectronic element for carrying the respective signal thereto, wherein the signal carried by the first, second, third and fourth connections is subject to propagation delay of the same duration between the respective terminal and each of the corresponding contacts coupled thereto.

In accordance with a particular aspect of the invention, the packaging structure may have edges bounding the face, the face having a central region occupying a central portion thereof, and a second region occupying a portion of the face between the central portion and at least one of the edges. The terminals may include first terminals exposed at the central region and second terminals exposed at the second region, and the groups of connections couple the first terminals with the corresponding contacts. In such case, in a particular example, the microelectronic package may include further connections electrically coupling the second terminals with contacts of the microelectronic elements.

In accordance with a particular aspect of the invention, the packaging structure may include a substrate having first and second opposed surfaces, the first surface facing away from the microelectronic elements and the second surface facing towards the microelectronic elements, at least first and second apertures extending between the first and second surfaces. In a particular example, the apertures may have long dimensions with lengths which extend along axes parallel to one another. The central region may be bounded at least partly by the first and second apertures, and the connections can include leads which have portions aligned with at least one of the first or second apertures. In accordance with a particular aspect of the invention, the leads which have portions aligned with at least one of the apertures can include wire bonds. In a particular example thereof, the microelectronic package may further include third and fourth microelectronic elements each affixed with the packaging structure, wherein at least one of the groups of connections includes third and fourth connections electrically coupling the respective terminal to corresponding contacts of the third and fourth microelectronic elements for carrying the respective signal thereto, wherein the signal carried by the first, second, third and fourth connections is subject to propagation delay of the same duration between the respective terminal and each of the corresponding contacts coupled thereto. In accordance with a particular aspect, the parallel axes can be first parallel axes, and the substrate can further include third and fourth apertures which extend between the first and second surfaces. The third and fourth apertures can have long dimensions having lengths extending along second axes parallel to one another, the second parallel axes being transverse to the first parallel axes, wherein the central region is bounded at least partly by the third and fourth apertures, and the connections include leads having portions aligned with at least one of the third or fourth apertures.

In accordance with a particular aspect of the invention, each of the first, second, third and fourth microelectronic elements is configured to provide predominantly a memory storage function.

In accordance with a particular example, third and fourth microelectronic elements can be affixed with the packaging structure, wherein at least one of the groups of connections includes third and fourth connections electrically coupling the respective terminal to corresponding contacts of the third and fourth microelectronic elements for carrying the respective signal thereto. The first, second, third and fourth connections can be configured such that the signal carried by the first, second, third and fourth connections is subject to propagation delay of the same duration between the respective terminal and each of the corresponding contacts coupled thereto. In a particular example, the central region of the face can be bounded by first parallel axes and second parallel axes transverse to the first parallel axes. Each first axis may bisect an area of one of the first and second microelectronic elements, respectively, and may extend in a direction parallel to first and second opposed edges of each of the first and second microelectronic elements. Each second axis may bisect an area of one of the third and fourth microelectronic elements, respectively, and may extend in a direction parallel to first and second opposed edges of each of the third and fourth microelectronic elements.

In accordance with a particular aspect of the invention, the packaging structure may include a substrate having contacts at a surface facing the microelectronic elements, the contacts of the microelectronic elements facing the substrate contacts and joined thereto. In accordance with a particular example, each of the first parallel axes may intersects exactly one of the third or fourth microelectronic elements, and each of the second parallel axes may intersect exactly one of the first or second microelectronic elements.

In accordance with a particular aspect of the invention, the microelectronic package may further include a circuit panel having panel contacts adjacent and electrically connected to the terminals, the circuit panel having conductive elements thereon which provide delay matching, such that signals carried by each group of connections to the microelectronic elements are subject to delay of the same duration through the packaging structure and the circuit panel.

In accordance with a particular aspect of the invention, the first and second microelectronic elements can be spaced apart from one another in a direction parallel to the face of the packaging structure.

In accordance with a particular aspect of the invention, the packaging structure may include a substrate having at least one aperture extending through the substrate, and the second microelectronic element may partially overlie the first microelectronic element such that contacts of the second microelectronic element are disposed beyond an edge of the first microelectronic element, wherein the connections to the corresponding contacts of the second microelectronic element include leads having portions aligned with the at least one aperture.

In accordance with a particular aspect of the invention, the leads can include wire bonds which extend through the at least one aperture.

In accordance with a particular aspect of the invention, the at least one aperture may include first and second bond windows, and the connections can include first leads coupled to the first microelectronic element having portions aligned with the first bond window, and second leads coupled to the second microelectronic element having portions aligned with the second bond window.

In accordance with a particular aspect of the invention, at least some of the terminals with which the first and second leads are coupled can be disposed between the first and second bond windows.

In accordance with a particular aspect of the invention, the first microelectronic element may have contacts at a front face thereof and a rear face opposed to the front face. The rear face may be mounted to the packaging structure, and the leads may include wire bonds connected between the contacts and the packaging structure.

In accordance with a particular aspect of the invention, at least one of the first or second microelectronic elements may include a memory storage array and at least one of the first or second microelectronic elements may include a microcontroller.

In accordance with a particular aspect of the invention, the packaging structure may include a dielectric layer formed on the contact-bearing surfaces of the first and second microelectronic elements, traces extending in a direction parallel to the dielectric layer, and metalized vias extending at least partly through a thickness of the dielectric layer and electrically coupled with the contacts of the first and second microelectronic elements, wherein the terminals are electrically connected to the contacts by the traces and the vias.

A method of making a microelectronic package according to an aspect of the invention can include forming electrical connections coupling first and second microelectronic elements with packaging structure having a plurality of terminals disposed at a face thereof, the terminals being configured for connecting the microelectronic package to at least one component external to the package. The connections can include groups of connections for carrying respective signals, each group including two or more connections, e.g., a first connection extending from a respective terminal of the package to a corresponding contact on the first microelectronic element and a second connection extending from the respective terminal to a corresponding contact on the second microelectronic element. The first and second connections can be configured such that a respective signal carried by the first and second connections in each group is subject to propagation delay of the same duration between the respective terminal and each of the corresponding contacts coupled thereto.

In accordance with a particular aspect of the invention, the packaging structure may have edges bounding the face, and the face may have a central region occupying a central portion thereof, and a second region occupying a portion of the face between the central portion and at least one of the edges. The terminals can include first terminals exposed at the central region and second terminals exposed at the second region. The groups of connections may couple the first terminals with the corresponding contacts, and the microelectronic package can include further connections electrically coupling the second terminals with contacts of the microelectronic elements.

In accordance with a particular aspect of the invention, the packaging structure can include a substrate having at least one aperture extending through the substrate, and the second microelectronic element may partially overlie the first microelectronic element. In such way, contacts of the second microelectronic element can be disposed beyond an edge of the first microelectronic element. Connections to the corresponding contacts of the second microelectronic element may include leads having portions aligned with the at least one aperture.

BRIEF DESCRIPTION OF THE DRAWINGS

FIG. 1C is a sectional view illustrating a microelectronic package assembled with a circuit panel according to an embodiment of the invention.

FIGS. 6A and 6B are a plan view and a corresponding sectional view of a microelectronic package according to a variation of the embodiment shown in FIGS. 1A-1C.

FIG. 6C is a sectional view of a microelectronic package according to a variation of the embodiment shown in FIGS. 6A and 6B.

FIGS. 7A and 7B are a plan view and a corresponding sectional view of a microelectronic package according to a variation of the embodiment shown in FIGS. 1A-1C.

FIG. 8 is a sectional view of a microelectronic package according to a variation of the embodiment shown in FIGS. 7A and 7B.

FIG. 9A is a plan view looking towards a bottom surface of a microelectronic package according to a variation of the embodiment shown in FIGS. 1A-1C.

DETAILED DESCRIPTION

Figure 1:
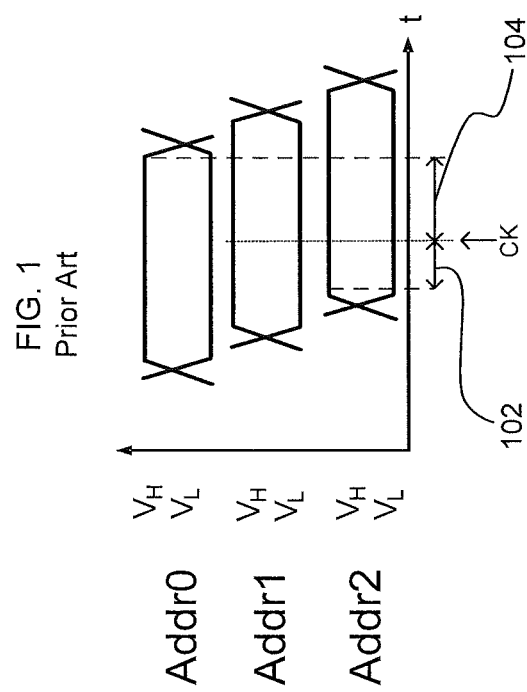
FIG. 1 is a timing diagram illustrating skew in the arrival of signals in accordance with the prior art.

Embodiments of the invention herein provide packages which have more than one semiconductor chip, i.e., a microelectronic element therein. A multiple chip package can reduce the amount of area or space required to connect the chips therein to a circuit panel, e.g., printed wiring board to which the package may be electrically and mechanically connected through an array of terminals, such as a ball grid array, land grid array or pin grid array, among others. Such connection space is particularly limited in small or portable computing devices, e.g., handheld devices such as "smartphones" or tablets which typically combine the function of personal computers with wireless connectivity to the broader world. Multi-chip packages can be particularly useful for making large amounts of relatively inexpensive memory available to a system, such as advanced high performance dynamic random access memory ("DRAM") chips, e.g., in DDR3 type DRAM chips and its follow-ons.

The amount of area of the circuit panel needed to connect the multi-chip package thereto can be reduced by providing common terminals on the package through which at least some signals travel on their way to or from two or more chips within the package. However, doing so in a way that supports high performance operation presents challenges. To avoid undesirable effects such as noise and propagation delays within the package, the traces, vias, and other conductors which electrically connect the terminals at the exterior of the package with the chips therein must not be too long or too narrow in order to avoid excessive inductance and stub length, and must not have excessive capacitance. Heat dissipation also presents a challenge for advanced chips, such that it is desirable for at least one of the large flat surfaces of each chip to be coupled to a heat spreader or be exposed to or in thermal communication with a flow or air within an installed system. The packages described below can help to further these goals.

Embodiments of the invention herein provide ways of de-skewing signals carried within microelectronic packages that have at least two microelectronic elements, wherein each of a plurality of microelectronic elements in the package transmits or receives some of the same signals through a set of common terminals of the package. Thus, corresponding contacts of multiple chips within the package can be electrically connected with a single common terminal of the package which is configured for connection with a component external to the package, e.g., a circuit panel such as printed circuit board, external microelectronic element or other component.

The structures and processes herein help to achieve a de-skewed timing of a signal from a common package terminal to contacts on more than one chip through one or more of the following: placement of at least some common terminals of the package used for carrying time-varying signals in a region of the package between at least two of the chips; and design of traces or other conductors of the package such that the signal propagation delay between each common terminal and the corresponding contacts of each chip connected thereto is the same, i.e., within a limited tolerance.

Figure 1A:
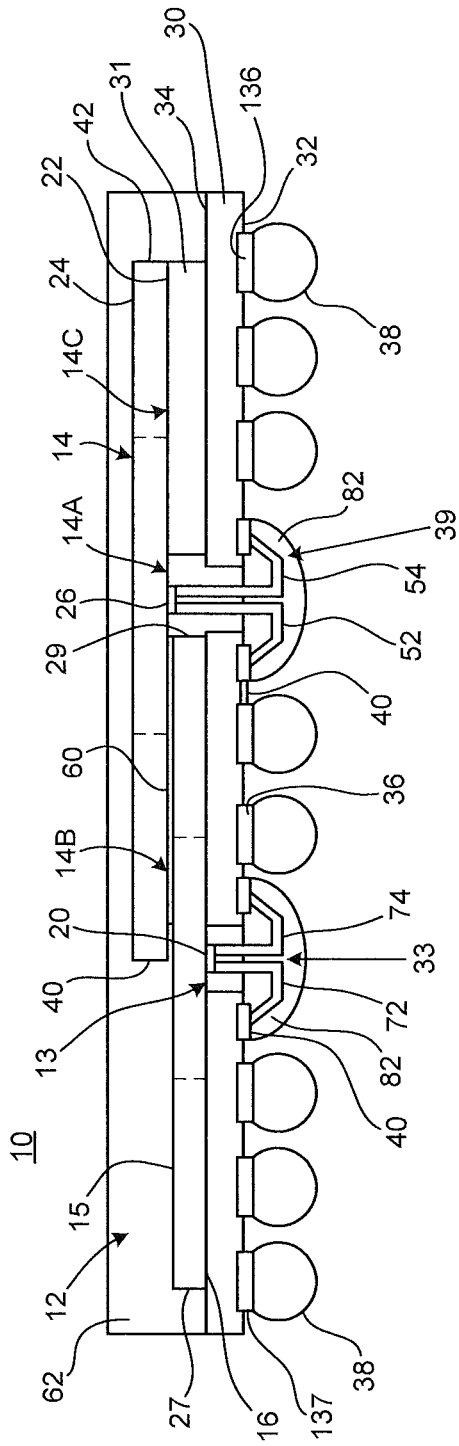
FIG. 1A is a sectional view illustrating a microelectronic package according to an embodiment of the invention.
Figure 1E:
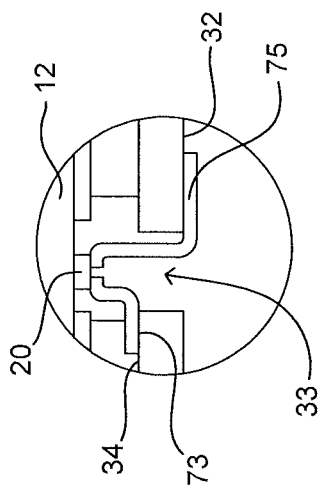
FIG. 1E is partial fragmentary view illustrating beam lead electrical connections according to particular implementations of the embodiment shown in FIGS. 1A-1C.
Figure 1B:
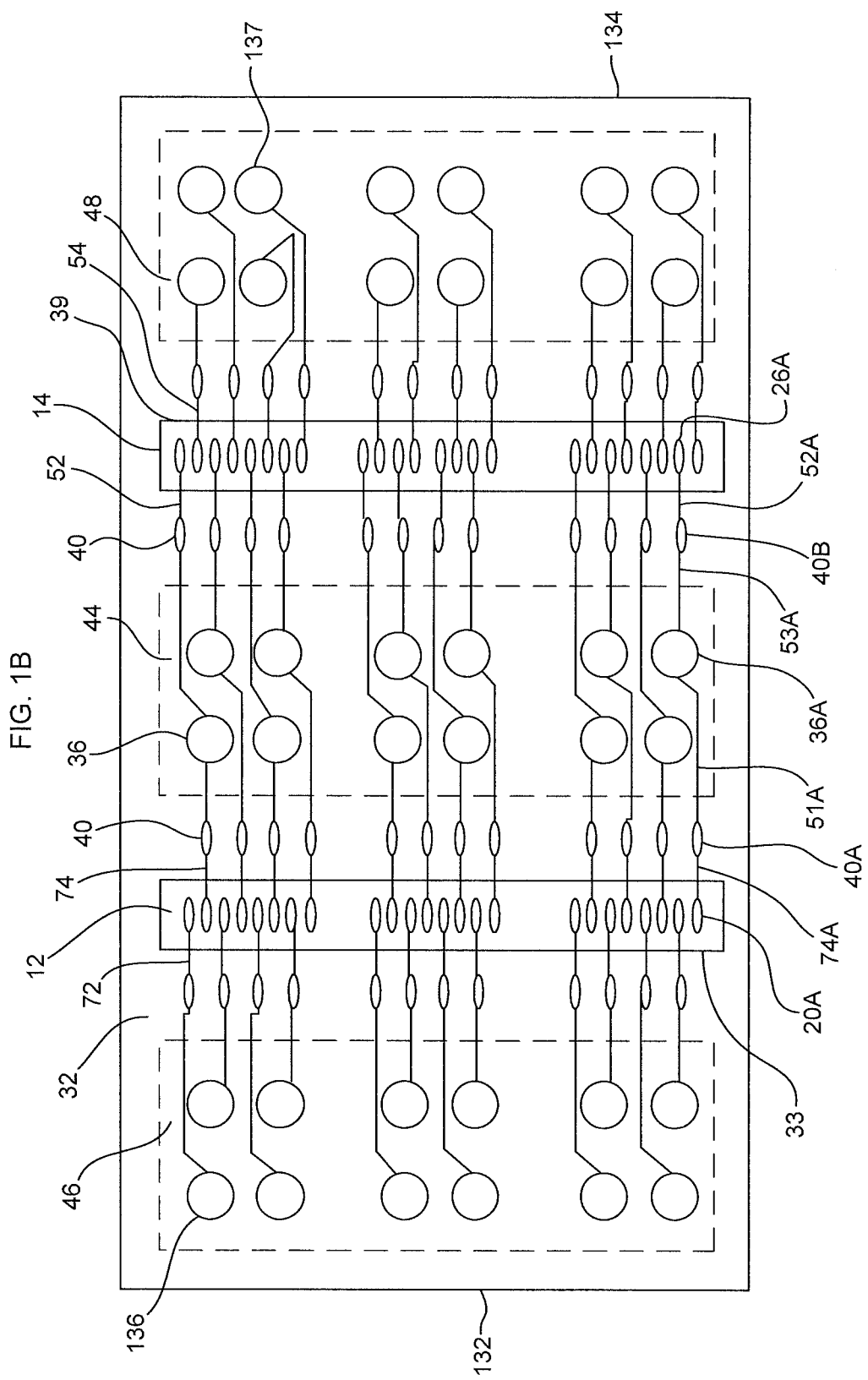
FIG. 1B is plan view looking towards a terminal-bearing or bottom surface of a package in accordance with an embodiment of the invention.

FIGS. 1A-B illustrates a particular type of microelectronic assembly or package 10 in which de-skewing of signals can be achieved according to an embodiment of the invention. As seen therein, the package 10 includes a first microelectronic element 12 having a front face 16 and a plurality of electrically conductive contacts 20 at a front face thereof. For example, as illustrated in FIGS. 1A-B, contacts 20 can be arranged in one or more rows disposed in a central region 13 of the front face 16 which occupies a central portion of an area of the front face. The central region 13, for example, may occupy an area of the front face which includes a middle third of the shortest distance between opposed peripheral edges 27, 29 of the first microelectronic element. In one example, first and second microelectronic elements can be bare chips or microelectronic units each configured to predominantly provide memory storage array function. Thus, in one example, each microelectronic element can incorporate a dynamic random access memory ("DRAM") storage array or which is configured to predominantly function as a DRAM storage array. Such "memory" microelectronic element or "memory chip" may have a greater number of active circuit elements, e.g., active semiconductor devices, which are configured to provide memory storage array function than any other function of the microelectronic element.

The package includes packaging structure, for example, an optional substrate 30 with terminals 36, e.g., conductive pads 36, lands or conductive posts thereon. In some cases, the substrate may consist essentially of a material having a low coefficient of thermal expansion ("CTE"), i.e., a CTE of less than 10 parts per million per degree Celsius (hereinafter, "ppm/° C."), such as a semiconductor material e.g., silicon, or a dielectric material such as ceramic material or silicon dioxide, e.g., glass. Alternatively, the substrate may include a sheet-like dielectric element which can consist essentially of a polymeric material such as polyimide, epoxy, thermoplastic, thermoset plastic, or other suitable polymeric material or which includes or consists essentially of composite polymeric-inorganic material such as a glass reinforced structure of BT resin (bismaleimide triazine) or epoxy-glass, such as FR-4, among others. Electrical connections between the contacts 20 and terminals 36 can include optional leads, e.g., wire bonds 72, 74, or other possible structure in which at least portions of the leads are aligned with an aperture extending between surfaces 32, 34 of the substrate. For example, as seen in FIG. 1E, the connections can include a beam lead 73 which extends along a surface 34 of the substrate which faces microelectronic element 12, such lead extending beyond an edge of the substrate or extending beyond an edge of an aperture 33 in the substrate, and joined to the contact 20. Alternatively, a beam lead 75 joined to contact 20 may instead extend along a surface 32 of the substrate which faces away from microelectronic element 12.

The terminals 36 function as endpoints for the connection of the microelectronic package 10 with corresponding electrically conductive elements of an external component such as a circuit panel, e.g., printed wiring board, flexible circuit panel, socket, other microelectronic assembly or package, interposer, or passive component assembly, among others. In a particular example, the terminals of the package 10 may include joining elements 38, e.g., conductive masses such as solder balls, masses of conductive material, such as conductive paste, conductive matrix material, or conductive adhesive attached to the terminals.

As further seen in FIG. 1A, the package 10 can further include a second microelectronic element 14 having a front face 22 with a plurality of contacts 26 thereon. In the particular example of FIG. 1A, the contacts 26 of the second microelectronic element 14 are disposed beyond a peripheral edge 29 of the first microelectronic element. This permits electrical connections between the contacts 26 and the terminals 36 to include leads, e.g., wire bonds 52, 54 extending from the contacts 26 of the second microelectronic element 14 at least partially within an aperture 39 or gap of the packaging structure 10. In a particular embodiment, the leads joined to contacts 26 can be arranged as shown and described above relative to FIG. 1E. In one example, contacts 26 of the second microelectronic element 14 can be disposed within a central region 14A of the front face 28 thereof, the central region being separated from peripheral edges 40 and 42 by peripheral regions 14B and 14C of the second microelectronic element.

In a particular embodiment as seen in FIG. 1A, the packaging structure may define apertures or gaps 33, 39 within which or through which leads such as wire bonds 72, 74 or other types of electrical connections may be aligned. For example, as seen in FIGS. 1A-B, apertures 33, 39 can extend between first and second opposed surfaces 32, 34 of a substrate 30. In the example of FIGS. 1A-B, leads 72, 74 can have portions aligned with the apertures 33, 39. In one embodiment, as seen in FIG. 1A, the leads can include or be wire bonds or beam leads extending from contacts 20 of first microelectronic element 12, or from contacts 26 of second microelectronic element 14 to conductive elements 40 at surface 32 of the substrate. The conductive elements can be further connected with the terminals 36.

In a particular embodiment, the leads can include or be beam leads 73 which extend along a surface 34 of the substrate which faces the surface 16, 22 of the first or second microelectronic elements, or both microelectronic elements and extends beyond an edge of an aperture 33 or 39 to contacts 20 or contacts 26 or both. In another embodiment, beam leads 75 can extend along a surface 32 of the substrate at the face of the packaging structure. In one embodiment, beam leads 73 and 75 can exist in the same package. An encapsulant 82 may optionally cover at least a portion of the leads and extend into the apertures or gaps of the packaging structure.

As further seen in FIG. 1A, the package may further include a third element such as a spacer 31 or other element between the second microelectronic element 14 and substrate 30. In one embodiment, the third element can be an element which has a low coefficient of thermal expansion ("CTE") such as an element having a low CTE of less than 10 parts per million per degree Celsius (hereinafter, "ppm/° C.". In one embodiment, the third element can consist essentially of semiconductor, glass, or ceramic material, or may consist essentially of liquid crystal polymer material or a filled polymeric material which includes filled particles which have a low CTE.

The package may further include an adhesive 60 between the adjacent faces of the first and second microelectronic elements 12, 14, and an encapsulant 62 contacting edge surfaces 27, 29, 40, 42. The encapsulant may optionally cover, partially cover, or leave uncovered the rear surfaces 15, 24 of the microelectronic elements 12, 14. For example, in the package shown in FIG. 1A, encapsulant 62 can be flowed, stenciled, screened or dispensed onto rear surfaces 15, 24 of the microelectronic elements. In another example, the encapsulant can be a mold compound which is formed thereon by overmolding.

As depicted in the bottom plan view of the microelectronic package 10 in FIG. 1B, locations of central terminals 36 are disposed in a corresponding central region 44 of the substrate. The central region 44 occupies area of the surface of the substrate between the apertures 33, 39. Peripheral regions 46, 48 of the substrate which can be disposed between the respective apertures 33, 39 and the edges 132, 134 of the substrate can accommodate peripheral terminals 136, 137, respectively.

In the embodiment of FIGS. 1A-B, at least some signals which pass through the central terminals 36 of the package are common to both microelectronic elements. These signals are routed through connections such as conductive traces extending in a direction parallel to the surface 32 of the substrate from the terminals 36 to the corresponding contacts 20, 26 of the first and second microelectronic elements 12, 14. For example, as shown in FIG. 1B, terminal 36A, one of many terminals 36 disposed in a central region 44 of the substrate surface 32, can be electrically connected with conductive contact 20A of the first microelectronic element 12 through a conductive trace 51A, conductive element 40A, e.g., a bond pad, and a wire bond 74A joined to the contact 40A and the contact 20A of the first microelectronic element 12. Terminal 36A can also be electrically connected with conductive contact 26A of the second microelectronic element 14 through a conductive trace 53A, conductive element 40B, e.g., a bond pad, and a wire bond 52A joined to the contact 40B and contact 26A of the second microelectronic element 14.

Referring to FIG. 1C, the terminals of the package can be joined to corresponding contacts 71 of an external component such as a circuit board 70 through joining element 38. In the specific arrangement herein, microelectronic package 10 routes a signal which is common to multiple microelectronic elements 12, 14 through a common central terminal 36A of the package, rather than through two or more terminals of the package each dedicated to a specific one of the microelectronic elements. In this way, an amount of area of the package substrate 30 occupied by such terminals can be reduced.

Figure 1D:
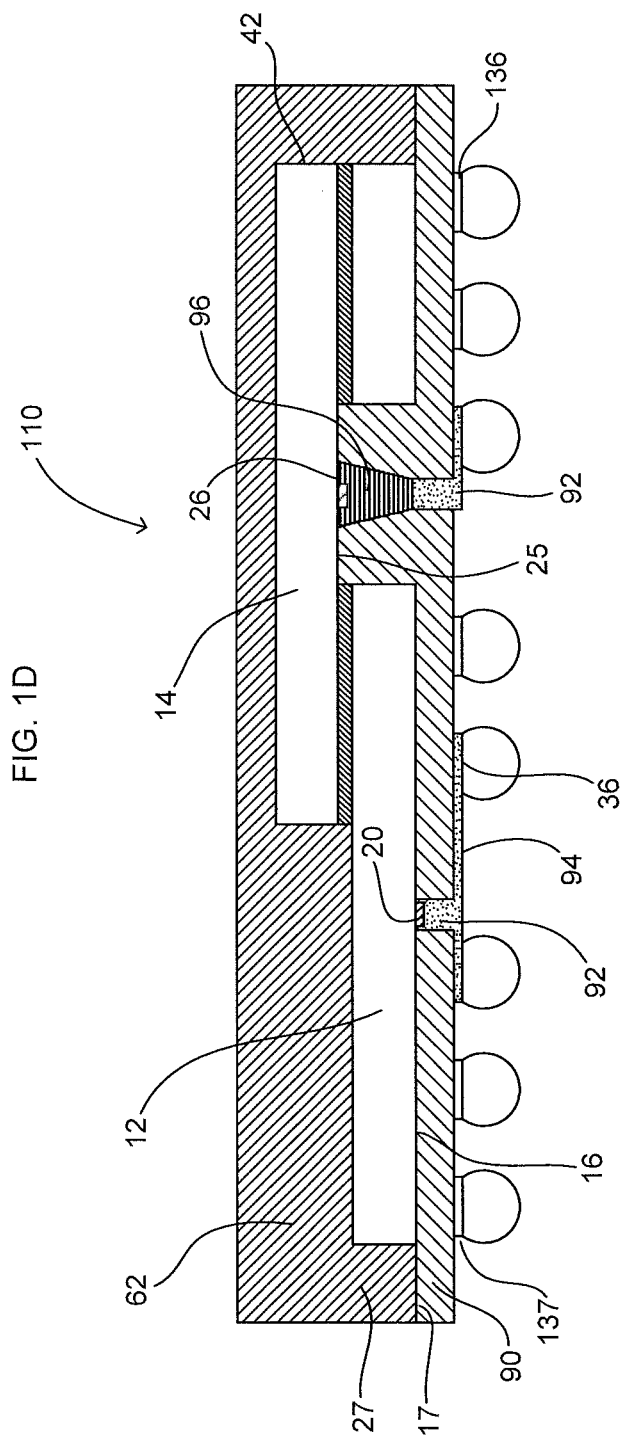
FIG. 1D is a sectional view illustrating a microelectronic package according to a variation of the embodiment of the invention shown in FIGS. 1A-1C.

FIG. 1D illustrates a microelectronic package 110 according to a variation of the above-described embodiment in which the packaging structure includes a dielectric layer 90 formed on surfaces of the first and second microelectronic elements 12, 14, and metallized vias 92 electrically coupled to contacts 20, 26 of the microelectronic elements and extending at least partially through a thickness of the dielectric layer. Electrically conductive traces 94 extend in one or more directions which are typically parallel to a surface 93 of the dielectric layer and electrically connect the metallized vias with terminals 36, 136, 137. The traces may be formed integrally with the metalized vias, and some or all traces and vias may include portions of a single monolithic metal layer, e.g., portions of a single layer of deposited metal, such as a layer of metal plated or otherwise deposited (e.g., screen-printed, stenciled, dispensed, etc.), onto the dielectric layer 90 and into openings in the dielectric layer to form the monolithic metal layer of which the traces and vias are made.

The package 110 may be a fan-out wafer-level package having a land grid array ("LGA") or ball grid array ("BGA") style connection arrangement of terminals thereon. The package 110 may have an encapsulant 62 extending beyond edges 27, 42 of the microelectronic elements 12, 14. The encapsulant 62 may be an overmold which has a surface 17 co-planar with or generally co-planar with a contact-bearing surface 16 of first microelectronic element 12. The dielectric layer 90 may overlie the encapsulant 62 and some of the terminals or traces can overlie the encapsulant 62.

Package 110 may be made according to techniques as described in one or more embodiments described in commonly owned U.S. application Ser. No. 12/953,994 filed Nov. 24, 2010, the disclosure of which is incorporated by reference herein. However, specific features, e.g., relative trace lengths, relative propagation delay between a terminal and corresponding contacts coupled thereto, and assignment and placement of package terminals for carrying particular signals are as described herein.

As further shown in FIG. 1D, package 110 may further include electrically conductive pillars 96, e.g., deposited, joined, bonded or etched metallic or metal-containing structures which effectively provide contacts raised above the contact-bearing surface 25 of the second microelectronic element. In a particular embodiment, although not shown, such pillars can also be provided on contacts 20 of the first microelectronic element. As shown in FIG. 1D, the metallized vias 92 can be coupled to the contacts 26 through pillars 96.

Figure 2:
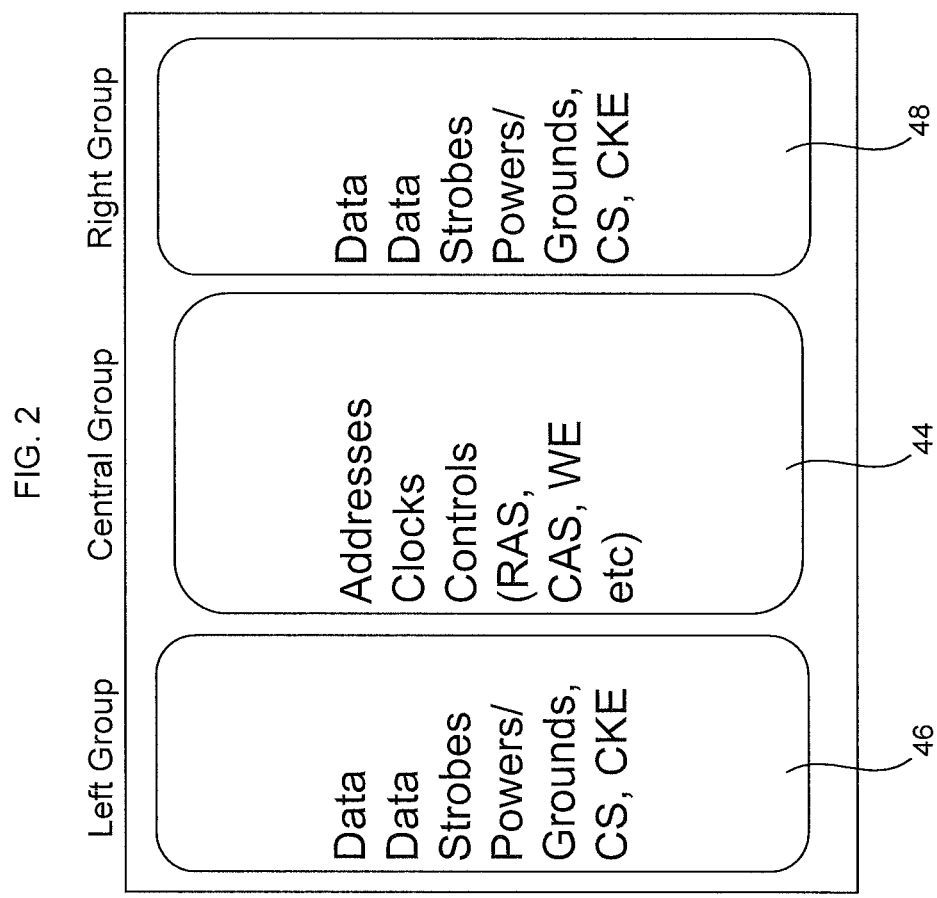
FIG. 2 is a plan view illustrating an arrangement of a central region and peripheral regions and terminal assignments of signals therein according to an embodiment of the invention.

Referring to FIG. 2, signals which are best routed through the central terminals (in central region 44) are signals which are utilized by each microelectronic element for operations performed in common by both microelectronic elements. In the above-described example in which first and second microelectronic elements 12, 14 each incorporates a DRAM storage array, address signals are utilized for common operations performed by the microelectronic elements, and are routed through common central terminals when possible. Signals which time operations such as address signals, clock signals, strobes, e.g., row address strobe, column address strobe, and write enable signals are also utilized for common operations and are best routed through central terminals which are common to the microelectronic elements within the package 10. Such signals can be used to sample the signals which enter or exit each microelectronic element 12, 14. Other electrical connections which do not involve critical timing paths and which can be routed through the peripheral terminals in peripheral regions 46, 48 of the substrate 30 include data signals, e.g., bi-directional data input-output signals, data strobes, connections to power and ground, column select signals and clock enable signals. By way of example, a clock enable signal can be used when active to switch a microelectronic element into an active operating mode when needed to perform operations, and alternatively when inactive can be used to switch the microelectronic element into an inactive operating mode, e.g., a standby mode or quiesced mode, when the microelectronic element is not needed to perform operations.

However, even when signals are routed through common central terminals, the structure can be configured further to de-skew the signals which pass therethrough to and from each microelectronic element. Signal de-skewing can be provided by ensuring that the electrical connections between each common terminal and contacts on each microelectronic element connected thereto have matched delays such that the signal carried on each of the electrical connections is subject to propagation delay of the same duration between the respective common central terminal and the corresponding contacts on each of the first and second microelectronic elements.

One way that matched propagation delays can be achieved between a common terminal and each microelectronic element is to structure the traces and other conductive elements on each path or connection from the common terminal to the respective microelectronic element (e.g., as seen in FIG. 1B, one path or a first connection including conductive elements 51A, 40A and 74A, and another path or second connection including conductive elements 53A, 40B and 52A), such that a signal carried by the first and second connections in the group of connections extending from the respective common terminal is subject to propagation delay of the same duration between the respective terminal and each of the corresponding contacts which are coupled to such terminal. To some extent, the delays on different paths or different connections extending from the common terminal are functions of the lengths of the respective paths or connections. Therefore, in some cases, the delays can be made the same by structuring the paths to have the same lengths. However, the propagation delays are also functions of the inductance, capacitance, and resistance on each path, and effects due to proximity of other conductive features adjacent to each path. Therefore, these additional factors must also be considered when structuring the conductive elements which make up the paths or connections. When the delays on each path or connection through a particular common terminal to corresponding contacts are the same, the paths can be said to have the same "total electrical lengths."

Figure 4:
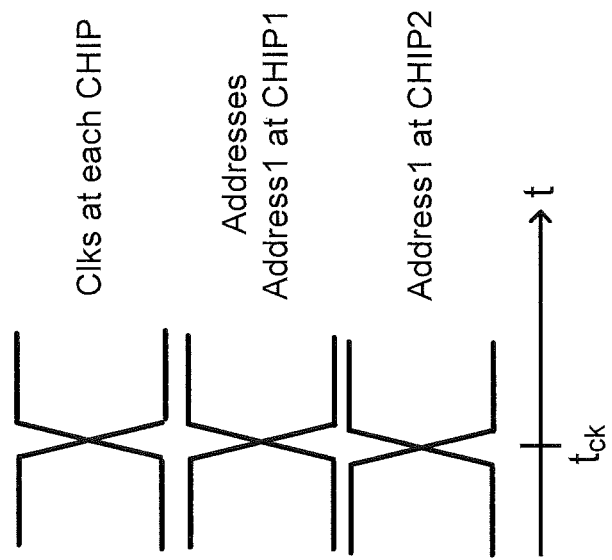
FIG. 4 is a timing diagram illustrating operation of a microelectronic package in accordance with an embodiment of the invention.
Figure 3:
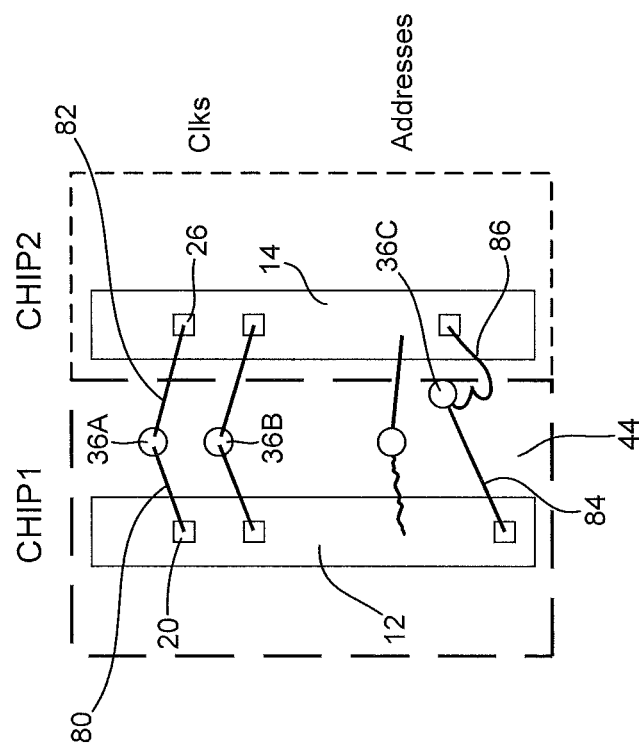
FIG. 3 is a plan view illustrating electrical connections between respective terminals and contacts of each of first and second microelectronic elements according to an embodiment of the invention.

FIGS. 3 and 4 further illustrate the above-described principles. As seen in FIG. 3, common terminals 36A-36B, through which clock signals travel to contacts of respective microelectronic elements 12, 14 (denoted CHIP1 and CHIP2 in FIG. 3), can be centered within the central region 44 of the substrate. In this way, the lengths of paths 80, 82 to the contacts 20, 26 of the respective microelectronic elements can be the same within an allowed tolerance therefor. In one example, the tolerance can be 10% of the cycle time of a clock signal used to sample signals input to the microelectronic elements 12, 14. In another example, the tolerance can be smaller, such as 5% of the cycle time of the clock signal used to sample signals input to the microelectronic elements 12, 14. FIG. 4 illustrates that the clock signals received at the respective contacts 20, 26 of each chip (20 or 26, respectively) transition between high and low levels at a particular point in time $t_{CK}$.

FIG. 3 further illustrates the paths 84 and 86 which electrically connect a terminal 36C with the contacts 20, 26 of the respective microelectronic elements CHIP1 and CHIP2. Here, the paths 84, 86 need to be structured differently because the terminal 36C is closer to the contact 26 of CHIP2 than it is to contact 20 of CHIP1. Accordingly, while path 84 may be relatively straight, path 86 has jogs therein which increase its length. In this way, the total electrical lengths of the paths 84, 86 can be made the same, i.e., the same within tolerance. As a result, an address1 signal that is received at terminal 36C reaches contacts of each microelectronic element at the same time $t_{CK}$ as seen in FIG. 4. Note that in the example with terminal 36C, the lengths of the paths 84, 86 can be the same within tolerance, even when the straight line distances between terminal 36C and the contacts 20, 26 to which it is electrically connected are much greater than the tolerance therefor.

In addition, when the paths include wire bonds and traces, the length of the wire bond can be increased for the path which includes a shorter trace, or the length of the wire bond can be decreased for the path which includes a longer trace.

In another example, the degree of shielding which exists for a path in a package can be selectively reduced to reduce the delay on one path relative to another path, or can be selectively increased to increase the delay on a path relative to another path. For example, if the package includes a ground or power plane overlying conductors of the respective paths, a portion of such ground or power plane can be removed overlying one conductor such that a portion of the length of such conductor is unshielded, therefore reducing capacitance between such conductor and the ground or power plane. In this way, the reduced capacitance for the unshielded portion of the conductor has an effect of reducing the delay on such conductor.

In addition alternatively, an air gap can be created where appropriate to decrease the delay along a particular path, or the dielectric constant at a particular location of the substrate can be varied by allowing a particular dielectric material having a different dielectric constant, e.g., an encapsulant, solder mask, etc. to flow into location during fabrication.

Figure 5C:
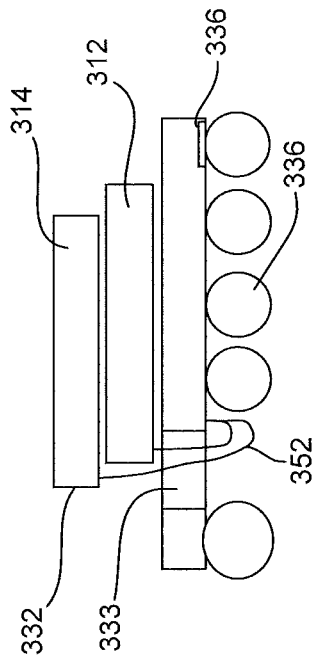
FIG. 5C is a sectional view of a microelectronic package according to a variation of the embodiment shown in FIGS. 1A-1C.
Figure 5B:
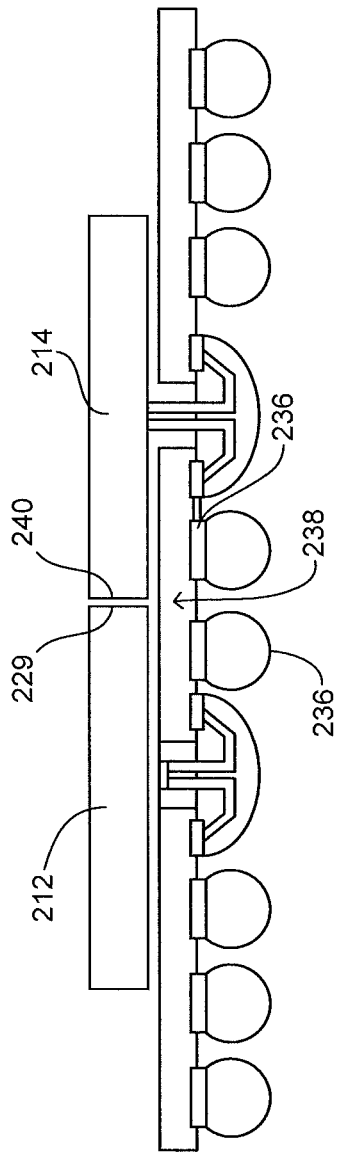
FIGS. 5A and 5B are a plan view and a corresponding sectional view of a microelectronic package according to a variation of the embodiment shown in FIGS. 1A-1C.
Figure 5A:
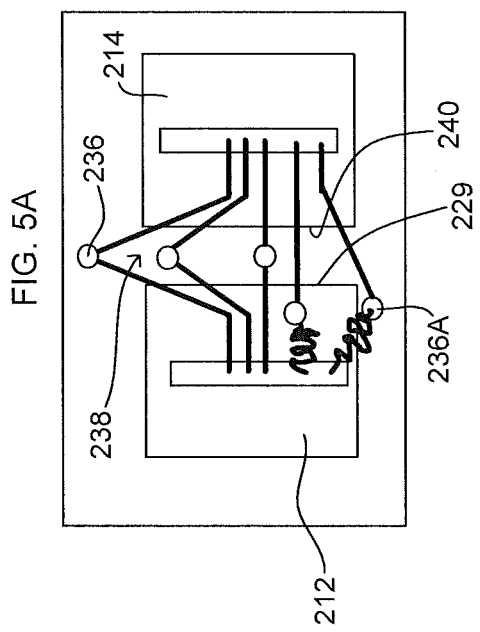

FIGS. 5A-5B illustrate a microelectronic package according a variation of the above-described embodiment (FIGS. 1A-1C) in which first and second microelectronic elements 212, 214 are spaced apart from one another and each bonded to the substrate. In this case, there is a space 238 on the substrate 230 which is uncovered by either the first or second microelectronic elements 212, 214, the space 238 disposed between peripheral edges 229, 240 of the microelectronic elements 212, 214. FIG. 5A illustrates that terminals 236 and the paths between them and respective microelectronic elements can be arranged according to the principles described above to achieve matched delays for each pair of electrical connections from a common central terminal 236, such as in the example shown at 236A.

FIG. 5C illustrates a variation in which each microelectronic element 312, 314 has contacts disposed adjacent a peripheral edge 332 thereof, and wire bonds 352 to each microelectronic element extend through the same aperture 333. The paths between the terminals and respective microelectronic elements can be arranged according to the principles described above to achieve matched delays for each pair of electrical connections from a common terminal 336 on the package.

FIGS. 6A-6B illustrates a further variation in which each microelectronic element 412, 414 is mounted face-up above the substrate 430 such that wire bonds 452 extend between contacts on the microelectronic elements to contacts (not shown) exposed at a surface 434 of the substrate opposite the terminals. In this case, common terminals 436A can be disposed at peripheral regions of the substrate surface 432 outside areas over which the microelectronic elements are disposed. In addition or alternatively, terminals can be disposed in regions of the substrate surface which underlie the microelectronic elements, as in the case of terminal 436B, or in regions between the microelectronic elements, as in the case of terminal 436C. Again, the paths between common terminals 436 and respective microelectronic elements can be arranged according to the principles described above to achieve matched delays for each pair of electrical connections from a common terminal 436 on the package. For example, as indicated above, the total electrical lengths of the connections from a respective terminal to the contacts to which it is coupled can be made the same. Alternatively or in addition thereto, selective shielding or other means as described above can be used to achieve matched delays on the connections between a respective terminal and the contacts of each of the microelectronic elements coupled to such terminal.

FIG. 6C illustrates a further variation in which each microelectronic element 512, 514 is mounted face-up on the substrate and each microelectronic element has contacts disposed along a peripheral edge 532 thereof. Wire bonds 552 to each microelectronic element extend beyond adjacent edges 532 of the microelectronic elements. The paths between the terminals and respective microelectronic elements can be arranged according to the principles described above to achieve matched delays for each pair of electrical connections from a common terminal 536 on the package.

FIGS. 7A-7B illustrate a further variation in which each microelectronic element 612, 614 is flip-chip mounted to the substrate such that each microelectronic element has contacts 620 facing corresponding substrate contacts 640 on a surface 634 of the substrate, being joined thereto, such as through a joining element 642 such as a solder bump or other electrically conductive mass or joint 642. The paths between the terminals and respective microelectronic elements can be arranged according to the principles described above to achieve matched delays for each pair or group of electrical connections from a common terminal 636 on the package to corresponding contacts on each of the first and second microelectronic elements 612, 614.

FIG. 8 illustrates a variation of the embodiment shown in FIGS. 7A-7B in which a stacked assembly 790 of microelectronic elements 712, 714 can take the place of one or more of the microelectronic elements 612, 614. Microelectronic elements 712 and 714 can be of the same or different types. In this case, electrical connections between microelectronic elements within each stacked assembly can include through silicon vias 730, or edge connections (not shown) extending along one or more edges or peripheral edges of the assembly, or a combination thereof. Each microelectronic assembly can be a stacked assembly of unpackaged semiconductor chips or can be a stacked and electrically connected assembly of individually packaged chips.

FIG. 9A illustrates a further variation in which microelectronic package 800 includes first, second, third and fourth microelectronic elements which are disposed as shown therein. In a particular example, each microelectronic element can be a DRAM chip or can incorporate a DRAM storage array. In another example, the chips can include another type of memory which may be non-volatile such as flash memory. First and second microelectronic elements 812, 814 can be spaced apart and mounted to a surface of the substrate, with third and fourth microelectronic elements 816, 818 partially overlying the first and second microelectronic elements. The third and fourth microelectronic elements 816, 818 can be spaced apart from one another, each at least partially overlying the first and second microelectronic elements. Apertures, e.g., bond windows, extending through the substrate in a direction of a thickness of the substrate are shown at 833, 839, 843, and 849. Microelectronic package 800 can be arranged and fabricated in a manner similar to an embodiment (FIGS. 7-9) described in commonly owned U.S. Provisional Application 61/477,877 filed Apr. 21, 2011, the disclosure of which is incorporated by reference herein, although specific features, e.g., relative trace lengths, relative propagation delay between a terminal and corresponding contacts coupled thereto, and assignment and placement of package terminals for carrying particular signals are as described herein.

Figure 9B:
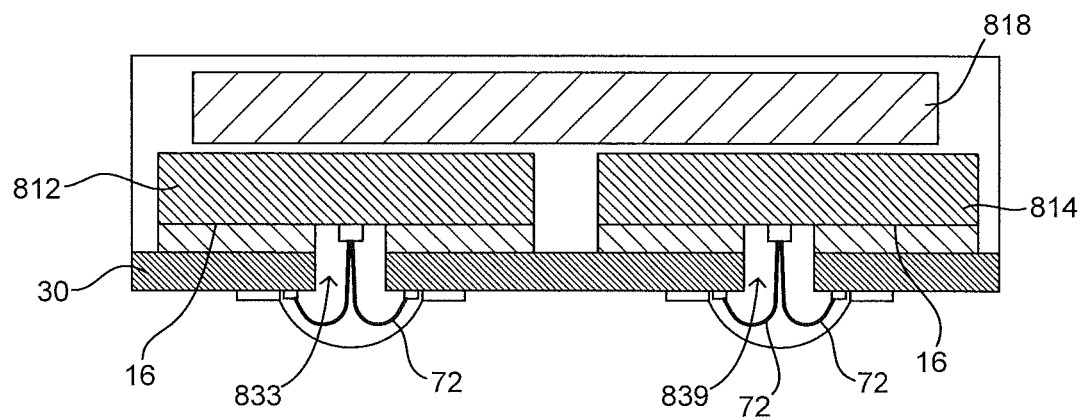
FIG. 9B is a sectional view through line 9B-9B of FIG. 9A.
Figure 9C:
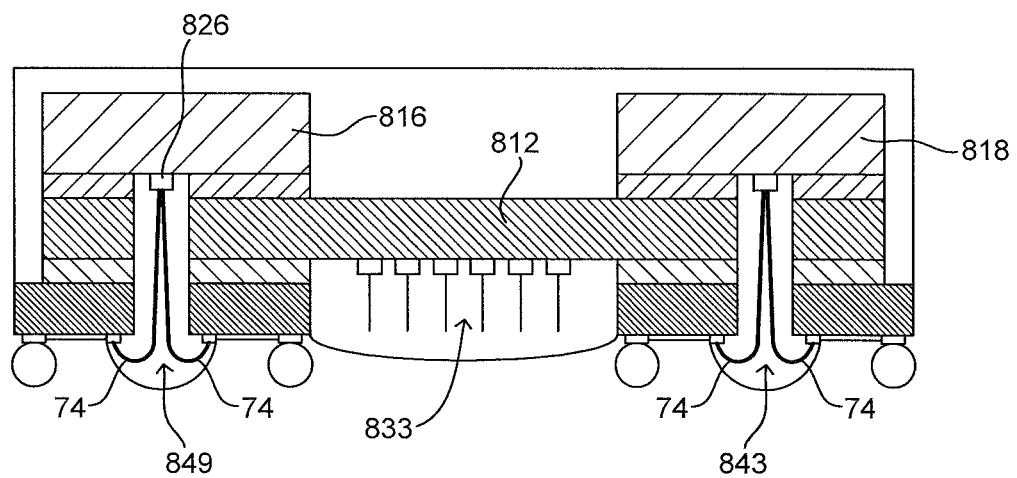
FIG. 9C is a sectional view through line 9C-9C of FIG. 9A.

As best seen in FIG. 9A, first and second apertures 833, 839 can be arranged such that the longest dimensions of the apertures, i.e., the lengths of the apertures 833, 839, extend along first parallel axes defined by line 9C-9C and line 9E-9E. As further seen, these first parallel axes 9C, 9E, in which the lengths of apertures 833, 839 extend are transverse to second parallel axes 850, 852 in which the longest dimensions (the lengths) of apertures 843, 849. The apertures 843, 849 can be disposed beyond respective opposite edges 820, 822 of the first and second microelectronic elements 816, 818. In this way, leads (FIG. 9C) can be electrically coupled with contacts 826 of the third and fourth microelectronic elements, the leads 74 having portions aligned with the apertures 843, 849. As described above relative to FIGS. 1A-D, the leads 74, as well as the leads 72 connected to the contacts of the first and second microelectronic elements 812, 814 (FIG. 9B) can include or can be wire bonds or beam leads.

Figure 9D:
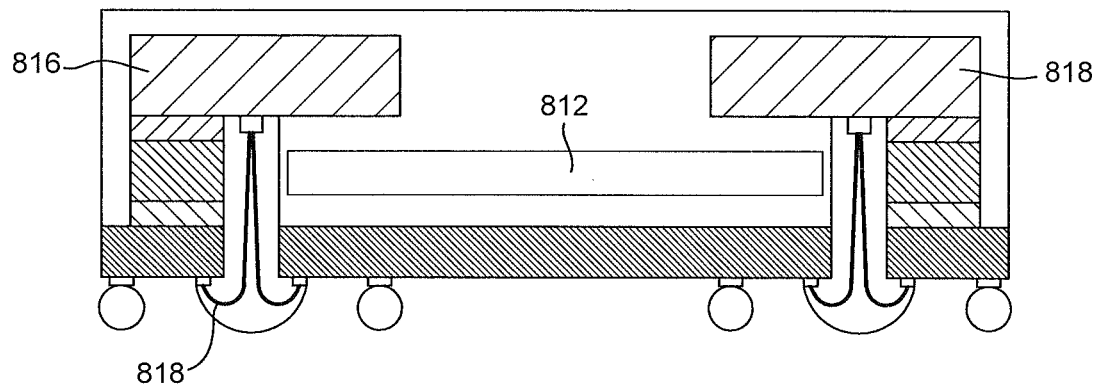
FIG. 9D is a sectional view through line 9D-9D of FIG. 9A.
Figure 9E:
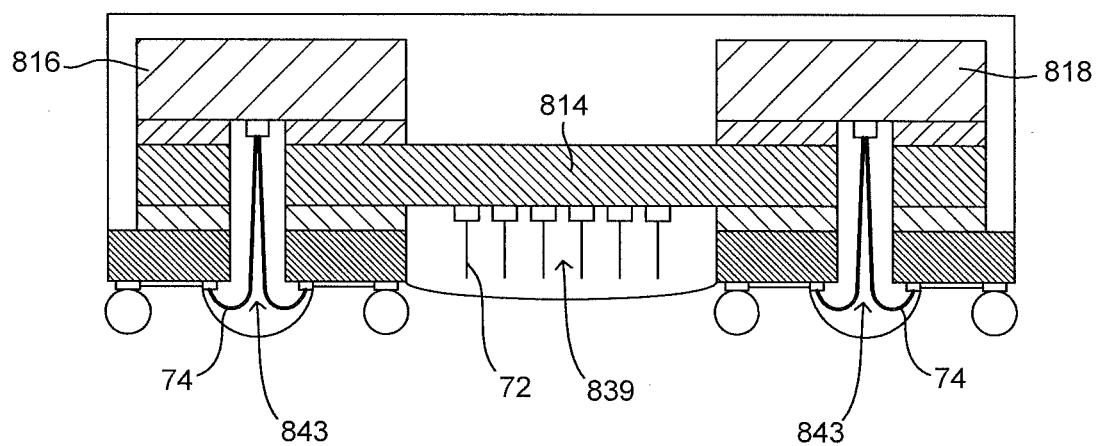
FIG. 9E is a sectional view through line 9E-9E of FIG. 9A.

FIG. 9B is a sectional view of microelectronic package through line 9B-9B of FIG. 9A. As seen therein, first and second microelectronic elements can be spaced apart from one another, with contact-bearing surfaces 16 thereof facing the substrate, and leads 72 having portions aligned with the apertures 833, 839. As seen in FIG. 9A, an axis 9C-9C, along which the length of aperture 833 extends, can intersect apertures 849, 843. As further seen in FIG. 9A, axis 9E-9E, extending in a direction of the length of aperture 839, can intersect apertures 843 and 849. FIG. 9D is a view of the package through line 9E-9E of FIG. 9A. The position of first microelectronic element 812 within the package is shown in relief using a dashed line, as the section along line 9D-9D (See FIG. 9A) runs between the first and second microelectronic elements.

Figure 10:
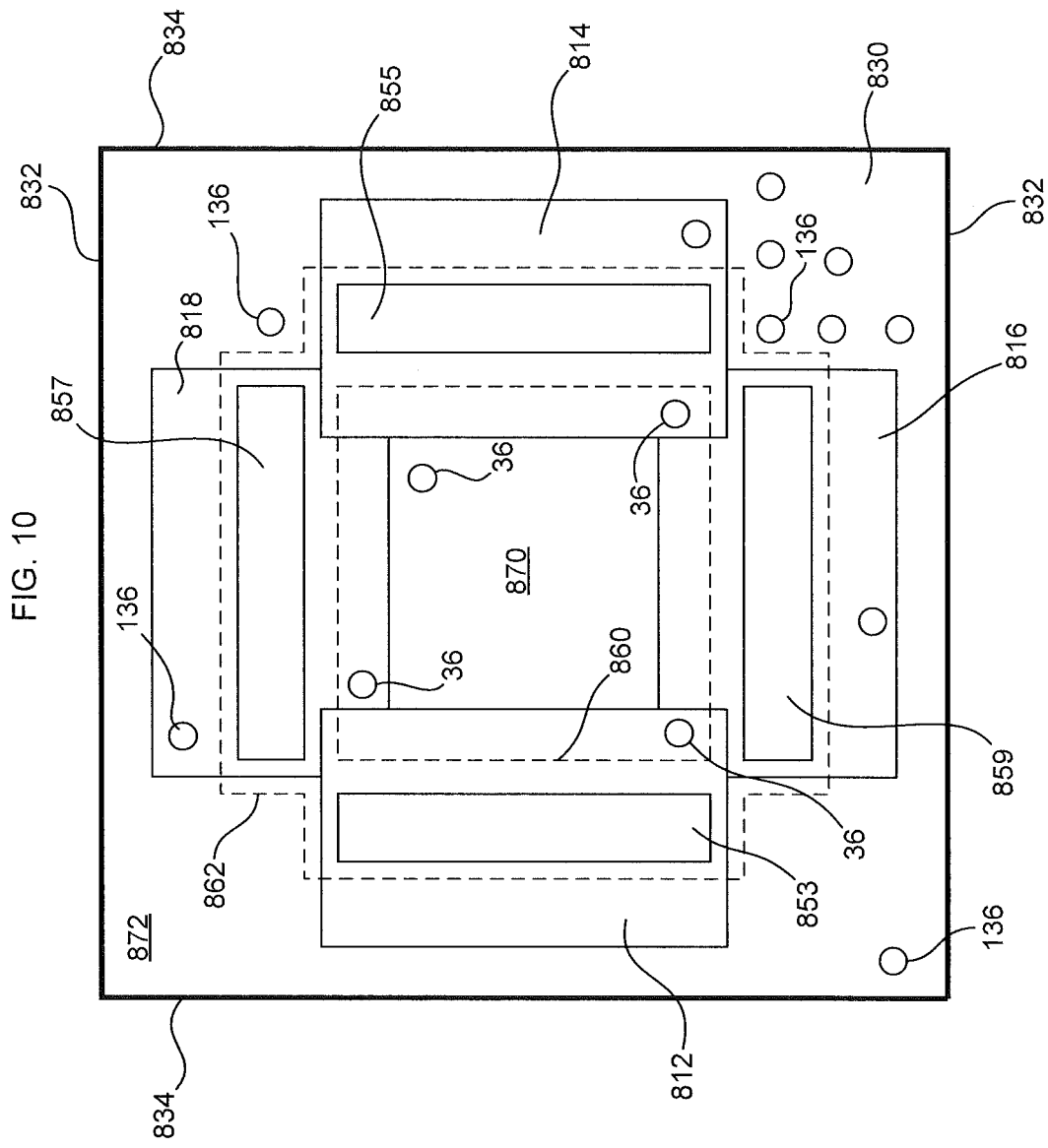
FIG. 10 is a plan view further illustrating an arrangement of terminals within an embodiment of the invention as shown in FIGS. 9A-9E.

The positions of a central region and a second or peripheral region of the substrate 830 of FIGS. 9A-9E are further illustrated in FIG. 10. The central region 870 has boundaries as shown at 860, the central region being bounded by the apertures (e.g., bond windows) 853, 855, 857, 859, or more specifically, the longest dimensions of the apertures. First terminals 36 typically are distributed throughout the central region, each of at least some of the first terminals being electrically coupled to contacts of two or more of the microelectronic elements 812, 814, 816, 818. As discussed above, the first terminals and the electrical connections between the first terminals and the contacts can be used to carry timing critical signals, such as clock signals, address signals, and command signals.

Second terminals 136 typically are distributed throughout a peripheral region 872 of the substrate disposed beyond edges of the central region 870. The peripheral region can be disposed beyond apertures 853, 855, 857, 859, being bounded by edges 832, 834 of the substrate and edges of the apertures as illustratively shown at 862. Typically, a second terminal connects only to a single contact of a single microelectronic element, although exceptions of course exist. The need to arrange structure within the package to de-skew signals carried by the second terminals, i.e., to make propagation delays the same from second terminals to the contacts the same, is not critical. This is because conductive elements on a circuit panel or board to which the package is connected can be arranged to selectively provide de-skewing to individual ones of the second terminals where needed. However, it is possible for a second terminal to be electrically coupled to more than one contact of a microelectronic element 812, 814, 816 or 818 within the package, or to corresponding contacts on more than one of the microelectronic elements. In this case, the potential, e.g., power or ground, or the signal carried by such second terminal can be one which is less sensitive to differences in arrival times of the potential or signal, i.e., to "skew", and therefore, no special arrangement may be needed on the package to compensate for the skew.

Figure 11:
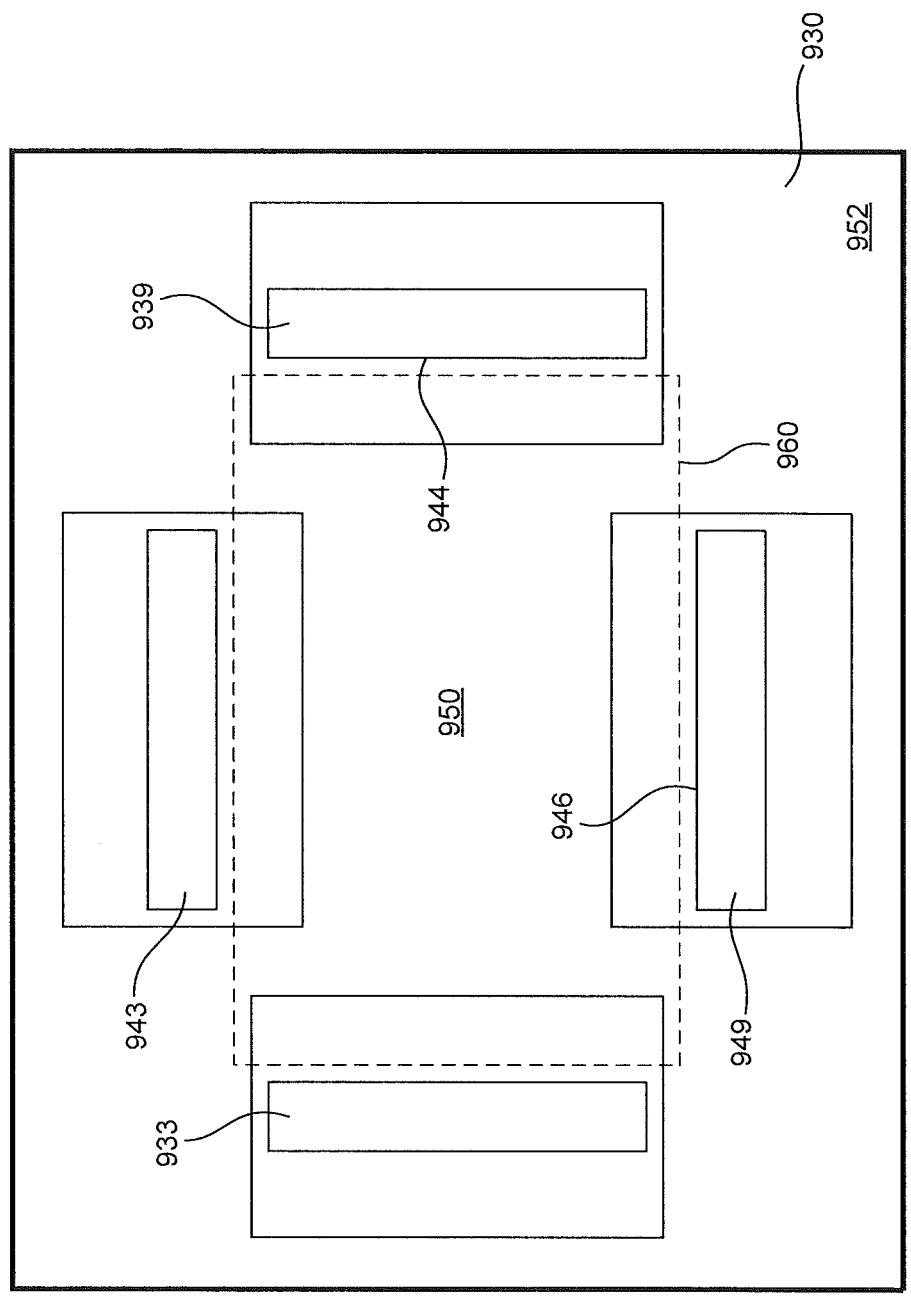
FIG. 11 is a plan view illustrating relative locations of microelectronic elements in a variation of an embodiment illustrated in FIGS. 9A-9E and 10.

FIG. 11 illustrates a variation of the embodiment described above relative to FIGS. 9A-9D and 10, in which the central region 950 has been enlarged by spacing the microelectronic elements farther apart from one another. The terminals and leads thereon are similar to those described above and can be omitted from the figure for clarity. Dashed line 960 marks a boundary between the central region 950 and the peripheral region 952. As in the embodiment of FIGS. 9A-9D and 10, the central region 960 can be disposed between edges 944, 946 which define the longest dimensions of the apertures 933, 939, 943, 949. The peripheral region occupies area of the substrate beyond the central region. In an arrangement as seen in FIG. 11, the central region may in some cases have larger area than the peripheral region so as to allow for a greater number of terminals to be arranged in the central region. As discussed above, the configurations discussed above for de-skewing of signals from shared terminals, i.e., for providing matched delays, can be implemented for shared terminals within such central region.

Figure 12:
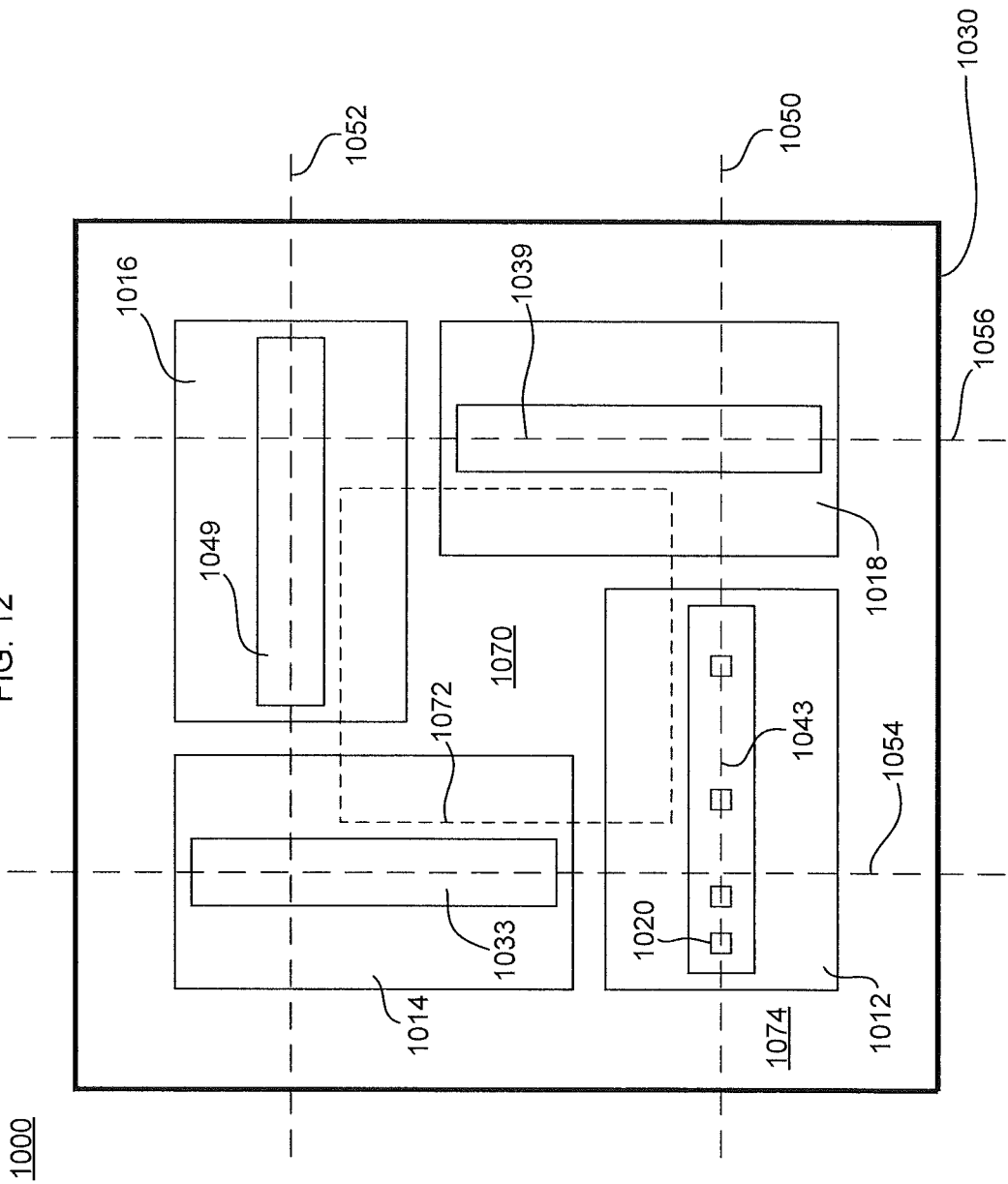
FIG. 12 is a plan view illustrating relative locations of microelectronic elements in a variation of an embodiment of FIGS. 9A-9E and 10.

FIG. 12 illustrates a particular arrangement of microelectronic elements 1012, 1014, 1016, 1018, on a substrate similar to the shape of a pinwheel. Again, the terminals and leads thereon are similar to those described above and can be omitted from the figure for clarity. In this case, the longest dimensions of apertures 1043, 1049 define first parallel axes 1050, 1052, and the longest dimensions of apertures 1033, 1039 define second parallel axes 1054, 1056. The second parallel axes are transverse to the first parallel axes. In the particular example shown in FIG. 12, when the contacts 1020 of each microelectronic element are arranged in a central region of the microelectronic element, the contacts 1020 can be arranged along an axis 1050 which bisects an area of a contact-bearing face of the microelectronic element 1012. Alternatively, the contacts 1020 can be arranged otherwise in one or more parallel columns of contacts which extend parallel to the axis 1050. Axis 1050 intersects the area of exactly one other microelectronic element in package 1000, that is, axis 1050 intersects the area of microelectronic element 1018. Similarly, an axis 1052 which bisects an area of the contact-bearing face of microelectronic element 1016 can intersect the area of exactly one other microelectronic element 1014. The same is also true of axis 1054 which can bisect the area of the contact-bearing face of the microelectronic element 1014 and intersect the area of exactly one other microelectronic element 1012. Indeed, this is also true of a similarly defined axis 1056 of microelectronic element 1018 which intersects the area of exactly one other microelectronic element 1016.

The arrangement of microelectronic elements 1012, 1014, 1016, 1018 on substrate 1030 defines a central region 1070 of the substrate having a boundary generally as shown by dashed line 1072, i.e., a rectangular area that is bounded by the apertures 1033, 1039, 1043, and 1049. Peripheral region 1074 lies outside of boundary 1072. The arrangement shown in FIG. 12 can be a particularly compact arrangement like that shown in FIGS. 9A-9D and 10, except that in FIG. 12 each microelectronic element is disposed adjacent to the substrate rather than partially overlying another microelectronic element as in the case of microelectronic elements 816, 818 of FIGS. 9A-9D. Thus, the arrangement can provide a compact arrangement of microelectronic elements and a relatively expansive central region without requiring a microelectronic element to overlie any other microelectronic element.

In variations of the embodiments described above it is possible for the contacts of microelectronic elements to not be disposed in central regions of the surfaces thereof. Rather, the contacts may be disposed in one or more rows adjacent an edge of such microelectronic element. In another variation, the contacts of a microelectronic element can be disposed adjacent two opposed edges of such microelectronic element. In yet another variation, the contacts of a microelectronic element can be disposed adjacent any two edges, or be disposed adjacent more than two edges of such microelectronic element. In such cases, locations of apertures in the substrate can be modified to correspond to such locations of the contacts disposed adjacent such edge or edges of the microelectronic element.

Figure 13:
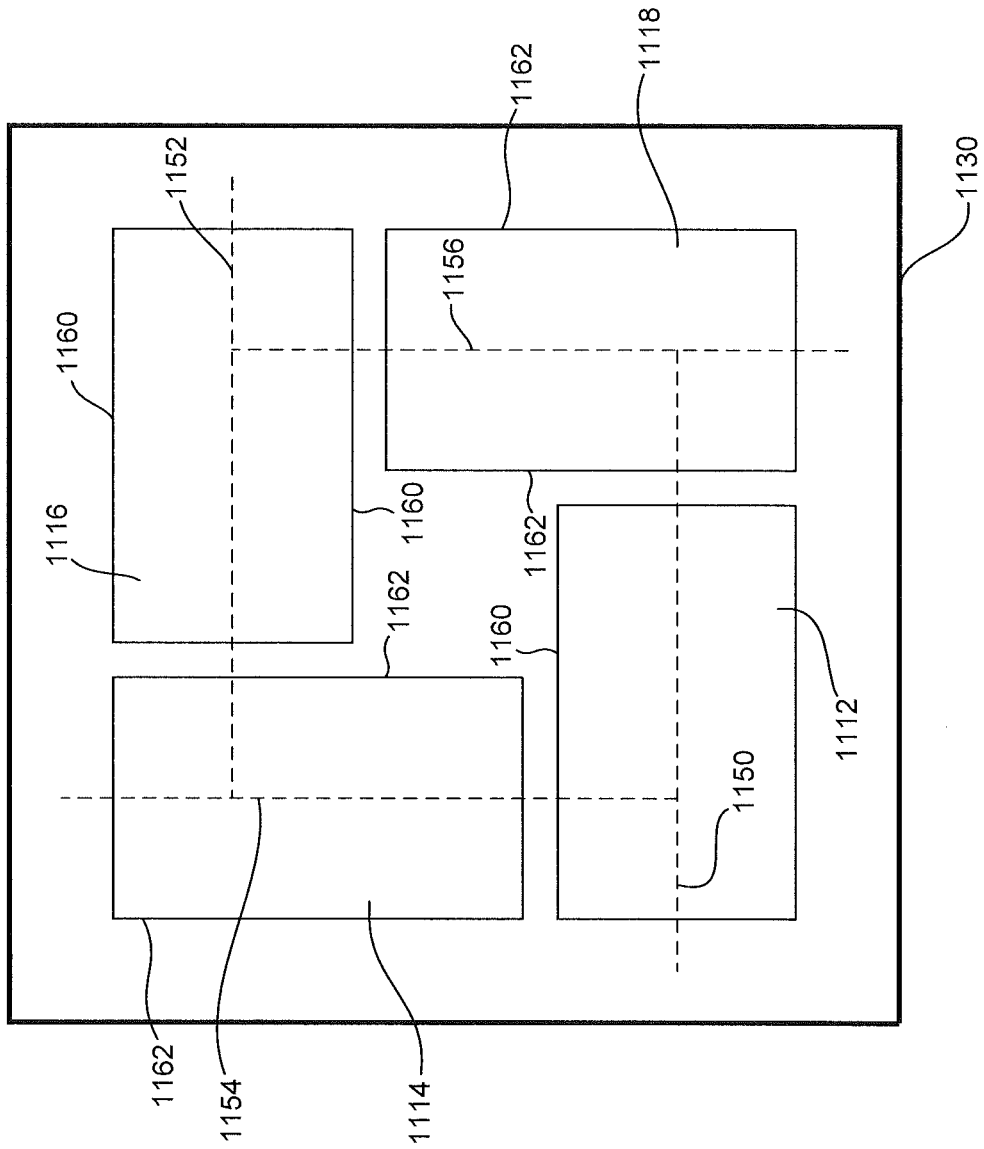
FIG. 13 is a plan view illustrating relative locations of microelectronic elements in a variation of an embodiment of FIG. 12.

FIG. 13 illustrates a variation of the embodiment shown in FIG. 12, in which apertures in the packaging structure are omitted. First parallel axes 1150, 1152 bisect the total areas of the contact-bearing faces of the microelectronic elements 1112, 1116 and extend in directions parallel to the peripheral edges 1160 of those microelectronic elements. Second parallel axes 1154, 1156 bisect the total areas of the contact-bearing faces of microelectronic elements 1114, 1118 and extend in directions parallel to the peripheral edges 1162 of those microelectronic elements. As in the embodiment of FIG. 12, and each axis intersects the area of exactly one microelectronic element other than the microelectronic element it bisects.

In one embodiment, the packaging structure may include a dielectric layer formed on surfaces of the microelectronic elements and conductive structure defining a redistribution layer thereon, such as described above relative to FIG. 1D. For example, metallized vias can be coupled to the contacts of each microelectronic element, and conductive structure, e.g., traces, can be electrically coupled to the metallized vias and the terminals of the package.

In another embodiment, the packaging structure can include a substrate having substrate contacts on a surface of the substrate. Corresponding contacts of the microelectronic elements can be arranged such that the contacts face the substrate contacts and be joined thereto in a flip-chip configuration, such as with conductive masses, e.g., masses of a bond metal such as solder, tin, indium, eutectic composition or combination thereof or other joining material such as a conductive paste. In a particular embodiment, the joints between the contacts and the substrate contacts can include an electrically conductive matrix material such as described in commonly owned U.S. application Ser. No. 13/155,719 filed Jun. 8, 2011 and Ser. No. 13/158,797 filed Jun. 13, 2011, the disclosures of which are incorporated by reference herein. In a particular embodiment, the joints can have a similar structure or be formed in a manner as described therein.

In a particular embodiment, one or more of the microelectronic elements may include a semiconductor chip having bond pads disposed in one, two, or more parallel adjacent rows thereon. In a particular embodiment, all of the rows of contacts can be disposed in a central region of the surface of such chip. Such microelectronic element can have a conductive redistribution layer formed thereon. For example, such microelectronic element can include a redistribution layer having metallized vias 92 and traces 94 coupled to the contacts 20 of the microelectronic element and overlying the contact-bearing surface of microelectronic element 12, as seen in FIG. 1D, although such microelectronic element omits semiconductor chip 14 and the conductive structure connected thereto. The redistribution layer may redistribute fine pitch contacts 20 on the semiconductor chip to redistribution contacts which are suitable for flip-chip bonding to a substrate 1130.

In another variation, first, second, third and fourth microelectronic elements, e.g., semiconductor chips 1112, 1114, 1116, and 1118 having contacts, e.g., bond pads, thereon can be arranged as seen in FIG. 13, a dielectric layer can be formed on the contact-bearing surfaces of the microelectronic elements, and a conductive redistribution layer can be formed having metallized vias electrically coupled to the contacts and to terminals at a face of the package. As in the above-described embodiments, the terminals are available at the face for connection to an external component such as a circuit panel or circuit board, such as through joining units, e.g., solder balls among others.

Contacts of microelectronic elements 1112, 1114, 1116, 1118 can be disposed in one or more rows within a central region of the microelectronic element, e.g., as described above relative to FIG. 12. Alternatively, the contacts of a microelectronic element can be distributed across a front face of such microelectronic element. In such case, the contacts may be existing conductive pads of the microelectronic element, such as made during processes used to fabricate a wafer from which the microelectronic element is made. Alternatively, the contacts can be formed in electrical communication with originally fabricated contacts. Another possibility is for the contacts to be redistribution contacts which are also formed in electrical communication with originally fabricated contacts, of which at least some are displaced in one or more lateral directions along a surface of the microelectronic element from the originally fabricated contacts. In yet another variation of the embodiment shown in FIG. 13, the contacts of a microelectronic element can be peripheral contacts disposed adjacent one or more of the edges of such microelectronic element.

Figure 14:
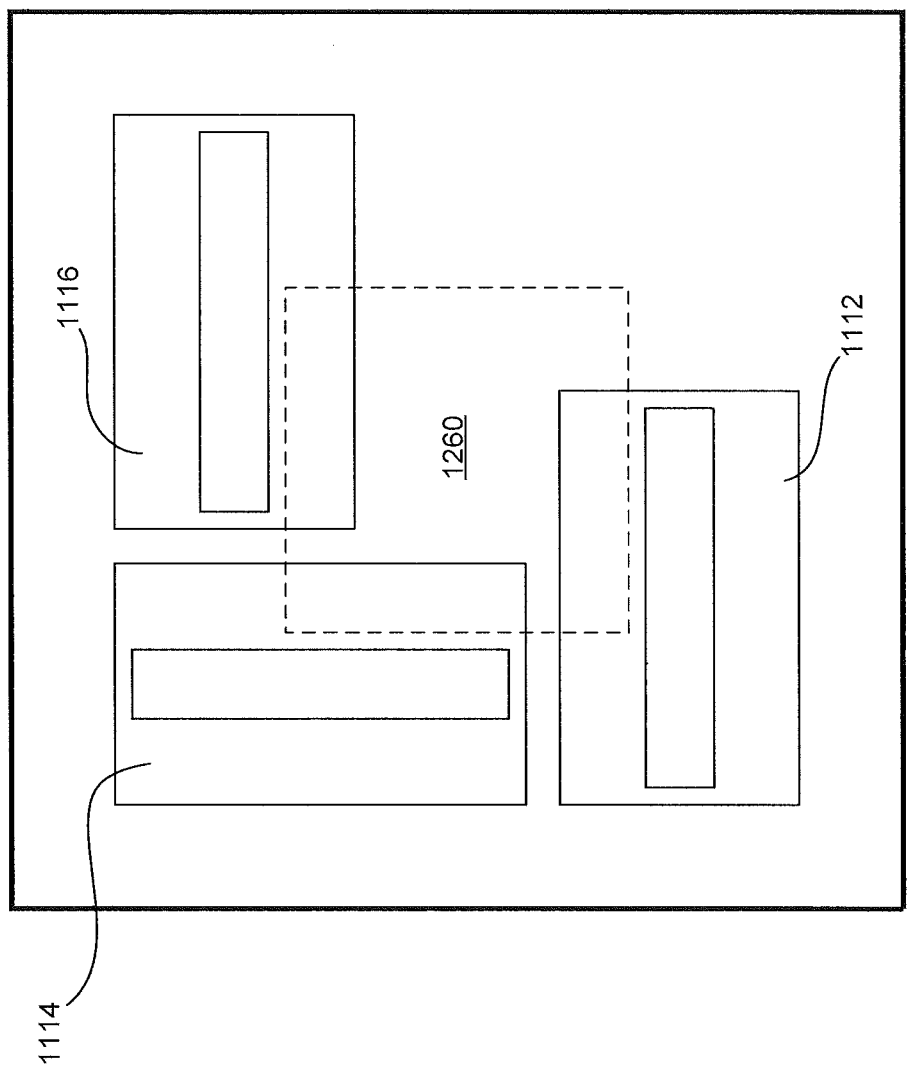
FIG. 14 is a plan view illustrating relative locations of microelectronic elements in a variation of an embodiment of FIG. 13.

FIG. 14 further illustrates that the above-described principles of providing a central region 1260 of the face of the packaging structure in which shared terminals can be disposed can be applied to packages having three microelectronic elements. A shared terminal, or one of many "first terminals" can be disposed within the central region, wherein a group of electrical connection can electrically couple a first terminal to contacts on each of the first, second and third microelectronic elements 1112, 1114, and 1116. The packaging structure can be as described in any of the embodiments described above.

Figure 15:
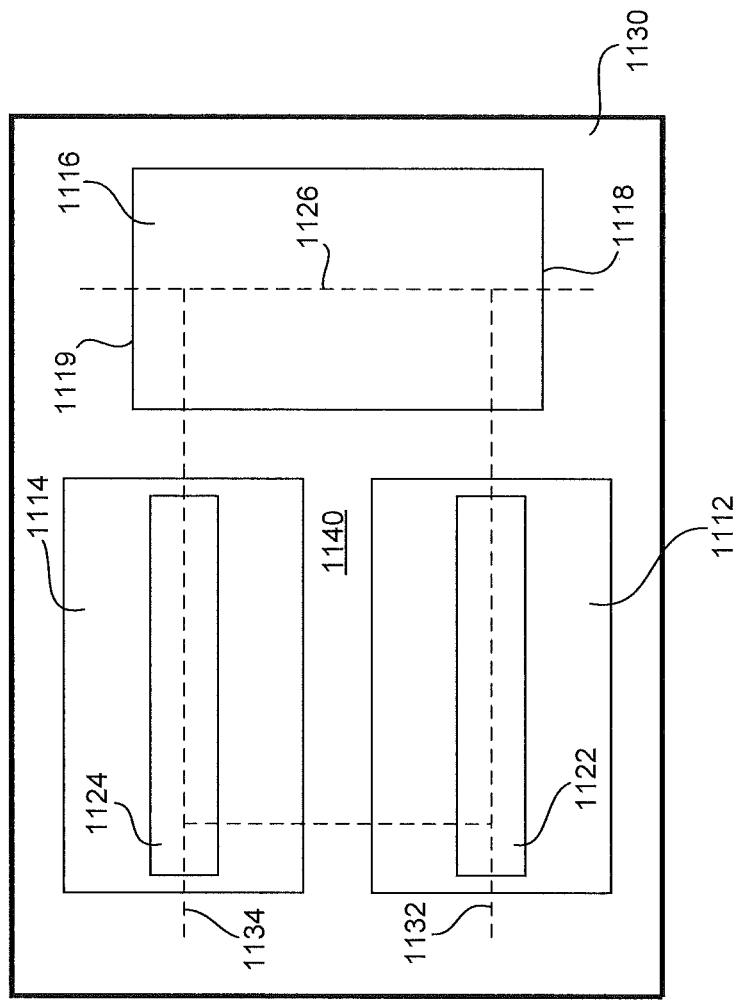
FIG. 15 is a plan view illustrating relative locations of microelectronic elements in a variation of an embodiment of FIG. 11.

FIG. 15 illustrates another embodiment in which three microelectronic elements can be packaged together in one unit. In a particular example, substrate 1130 can have first and second microelectronic elements 1112, 1114 each having contacts thereon aligned with an aperture or bond window 1122, 1124 extending between first and second surfaces of the substrate. As seen in FIG. 15, the apertures can have long dimensions, with lengths which extend along parallel axes 1132, 1134. An axis 1126 bisects an area of a contact-bearing of the third microelectronic element 1116 in a direction orthogonal to opposed edges 1118, 1119 of the third microelectronic element. The parallel axes 1132, 1134 and axis 1126, or the apertures 1122, 1124 and axis 1126 may at least partly bound the central region 1140.

In the embodiment depicted in FIG. 15, microelectronic elements 1112, 1114 may be configured to predominantly provide memory storage array function, such as described above. Another microelectronic element 1116 may also be configured to predominantly provide memory storage array function or another function such as logic.

In variations of the above-described embodiments as illustrated in any of the foregoing figures, one or more microelectronic elements therein can each be configured to predominantly provide a memory storage array function, e.g., as flash memory, DRAM or other type of memory. Such "memory" microelectronic element or "memory chip" may have a greater number of active circuit elements, e.g., active semiconductor devices, which are configured to provide memory storage array function than any other function of the microelectronic element. Such one or more memory microelectronic elements can be arranged in a package together with another "logic" microelectronic element or "logic chip" which is configured to predominantly provide logic function. Such "logic" microelectronic element or chip may have a greater number of active circuit elements, e.g., active semiconductor devices, which are configured to provide logic function than any other function of the microelectronic element.

In a particular embodiment, the logic chip can be a programmable or processor element such as a microprocessor or other general purpose computing element. The logic chip can be a microcontroller element, graphics processor, floating point processor, co-processor, digital signal processor, etc. In a particular embodiment, the logic chip can predominantly perform hardware state machine functions, or otherwise be hard-coded to serve a particular function or purpose. Alternatively, the logic chip can be an application specific integrated circuit ("ASIC") or field programmable gate array ("FPGA") chip. In such variation, the package then may be a "system in a package" ("SIP").

In another variation, a microelectronic element in the package can have both logic and memory function embedded therein, such as a programmable processor having one or more associated memory storage arrays embedded therewith in the same microelectronic element. Such microelectronic element is sometimes referred to as a "system-on-a-chip" ("SOC"), in that logic such as a processor is embedded together with other circuitry such as a memory storage array or circuitry for performing some other function, which may be a specialized function.

Figure 16:
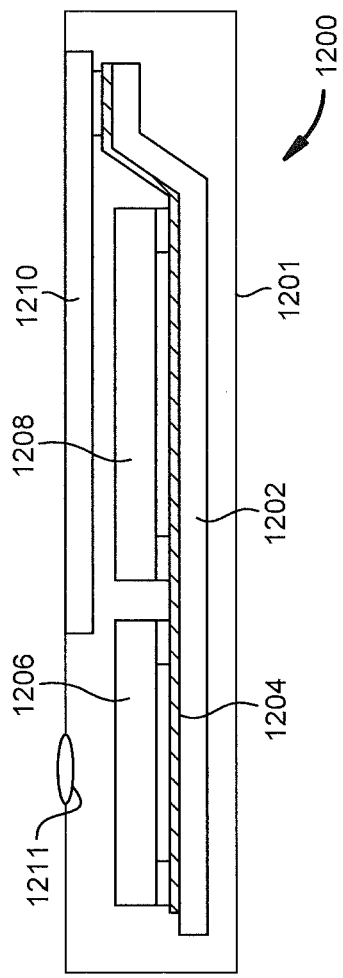
FIG. 16 is a schematic sectional view illustrating a system according to an embodiment of the invention.

The structures discussed above can be utilized in construction of diverse electronic systems. For example, as shown in FIG. 16 a system 1200 in accordance with a further embodiment of the invention includes a microelectronic package or structure 1206 as described above in conjunction with other electronic components 1208 and 1210. In the example depicted, component 1208 can be a semiconductor chip or microelectronic package whereas component 1210 is a display screen, but any other components can be used. Of course, although only two additional components are depicted in FIG. 16 for clarity of illustration, the system may include any number of such components. The structure 1206 as described above may be, for example, a microelectronic package as discussed above in connection with any of the above-described embodiments. In a further variant, more than one package may be provided, and any number of such packages can be used. Package 1206 and components 1208 and 1210 are mounted in a common housing 1201, schematically depicted in broken lines, and are electrically interconnected with one another as necessary to form the desired circuit. In the exemplary system shown, the system includes a circuit panel 1202 such as a flexible printed circuit panel or circuit board, and the circuit panel includes numerous conductors 1204, of which only one is depicted in FIG. 16, interconnecting the components with one another. However, this is merely exemplary; any suitable structure for making electrical connections can be used. The housing 1201 is depicted as a portable housing of the type usable, for example, in a cellular telephone or personal digital assistant, and screen 1210 is exposed at the surface of the housing. Where structure 1206 includes a light-sensitive element such as an imaging chip, a lens 1211 or other optical device also may be provided for routing light to the structure. Again, the simplified system shown in FIG. 16 is merely exemplary; other systems, including systems commonly regarded as fixed structures, such as desktop computers, routers and the like can be made using the structures discussed above.

Principles of the invention as described relative to any or all of the figures herein can be applied to the fabrication, i.e., a method of making a microelectronic package. Thus, a method of making a microelectronic package according to an embodiment of the invention can include forming electrical connections coupling first and second microelectronic elements with packaging structure having a plurality of terminals disposed at a face thereof such as seen in the figures as described above, the terminals being configured for connecting the microelectronic package to at least one component external to the package. The connections can include groups of connections for carrying respective signals, each group including a first connection extending from a respective terminal of the package to a corresponding contact on the first microelectronic element and a second connection extending from the respective terminal to a corresponding contact on the second microelectronic element, such that a respective signal carried by the first and second connections in each group is subject to propagation delay of the same duration between the respective terminal and each of the corresponding contacts coupled thereto.

Methods of fabricating microelectronic packages embodying additional features or further enhancements as described above can be made in accordance with the disclosure herein.

Various features of the above-described embodiments of the invention can be combined in ways other than as specifically described above without departing from the scope or spirit of the invention. It is intended for the present disclosure to cover all such combinations and variations of embodiments of the invention described above.

Moreover, in any of the embodiments described in the foregoing, the one or more second semiconductor chips can be implemented in one or more of the following technologies: DRAM, NAND flash memory, RRAM ("resistive RAM" or "resistive random access memory"), phase-change memory ("PCM"), magnetoresistive random access memory, e.g. such as may embody tunnel junction devices, spin-torque RAM, or content addressable memory, among others.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package, comprising:
a substrate having first and second oppositely facing surfaces and a plurality of terminals exposed at the first surface, the terminals being configured for connecting the microelectronic package to at least one component external to the package;
first and second microelectronic elements each having a face facing the second surface of the substrate;
connections electrically coupling the terminals of the package with the first and second microelectronic elements, the connections including groups of connections for carrying respective signals, each group including a first connection extending from a respective terminal of the package to a corresponding contact on the first microelectronic element and a second connection extending from the respective terminal to a corresponding contact on the second microelectronic element, the first and second connections being configured such that a respective signal carried by the first and second connections in each group is subject to propagation delay of the same duration between the respective terminal and each of the corresponding contacts coupled thereto,
wherein the substrate has edges bounding the first surface, the first surface having a central region occupying a central portion thereof, and a second region occupying a portion of the first surface between the central portion and at least one of the edges, the terminals including first terminals exposed at the central region and second terminals exposed at the second region, wherein the groups of connections couple the first terminals with the corresponding contacts for carrying signals comprising at least one of: address signals, clock signals usable for sampling the address signals, column address strobe, row address strobe or write enable,
wherein the microelectronic package includes further connections electrically coupling the second terminals with contacts of the microelectronic elements.

2. The microelectronic package as claimed in claim 1, wherein the substrate has at least first and second apertures extending between the first and second surfaces, the apertures having long dimensions with lengths extending along axes parallel to one another,
wherein the central region is bounded at least partly by the first and second apertures, and the connections include leads having portions aligned with at least one of the first or second apertures.

3. The microelectronic package as claimed in claim 1, wherein a difference between the total electrical lengths of the connections in a respective group of the connections is not greater than 10 percent, even when distances along straight lines between the terminal and the respective contacts coupled by such group of connections varies by greater than 10%.

4. A microelectronic package as claimed in claim 1, wherein the matched delay results at least partly from differences in a spacing of conductors in the electrical connections relative to other conductive structure of the substrate.

5. The microelectronic package as claimed in claim 1, wherein the same duration of the propagation delay of the respective signal on the first and second connections within each group is within a tolerance of ten percent of the cycle time of that signal.

6. A microelectronic package as claimed in claim 1, wherein the signals comprise a plurality of the address signals and a clock signal usable to sample the address signals.

7. The microelectronic package as claimed in claim 1, wherein the signals comprise a command signal.

8. The microelectronic package as claimed in claim 6, wherein the signals further comprise column address strobe, row address strobe and write enable.

9. The microelectronic package as claimed in claim 2, wherein each of the first and second microelectronic elements comprises a memory storage array, and the second microelectronic element partially overlies the first microelectronic element such that contacts of the second microelectronic element are exposed at the face of the second microelectronic element and disposed beyond an edge of the first microelectronic element,
wherein the first connections between the first terminals and the corresponding contacts of the first microelectronic element include first leads having portions aligned with the first aperture
the second connections to the corresponding contacts of the second microelectronic element include second leads having portions aligned with the second aperture.

10. The microelectronic package as claimed in claim 9, wherein each of the first and second microelectronic elements comprises a semiconductor chip implemented in a dynamic random access memory ("DRAM") technology.

11. The microelectronic package as claimed in claim 10, wherein the face of the second microelectronic element has first and second peripheral regions adjacent to first and second opposed peripheral edges of the second microelectronic element, respectively and the contacts of the second microelectronic element are disposed in a central region of the face of the second microelectronic element between the first and second peripheral regions, the central region and the first and second peripheral regions having equal width in a direction between the first and second peripheral edges, such that the central region occupies a middle third of a shortest distance between the first and second peripheral edges.

12. The microelectronic package as claimed in claim 11, wherein the face of the first microelectronic element has first and second peripheral regions adjacent to first and second opposed peripheral edges of the first microelectronic element, respectively, and the contacts of the first microelectronic element are disposed in a central region of the face of the first microelectronic element between the first and second peripheral regions of the first microelectronic element, the central region and the first and second peripheral regions of the first microelectronic element having equal width in a direction between the first and second peripheral edges of the first microelectronic element, such that the central region of the first microelectronic element occupies a middle third of a shortest distance between the first and second peripheral edges of the first microelectronic element.

13. The microelectronic package as claimed in claim 12, wherein the first leads comprise wire bonds extending through the first aperture and not extending through the second aperture, and the second leads comprise wire bonds extending through the second aperture and not extending through the first aperture.

14. A microelectronic package, comprising:
a substrate having first and second oppositely facing surfaces and a plurality of terminals exposed at the first surface, the terminals being configured for connecting the microelectronic package to at least one component external to the package, the substrate having first and second apertures extending between the first and second surfaces;
first and second microelectronic elements each comprising a memory storage array, each having a face facing the second surface of the substrate, the first microelectronic element having contacts exposed at its face which are aligned with the first aperture,
the face of the second microelectronic element partially overlying the first microelectronic element and the second microelectronic element having contacts exposed at its face which are aligned with the second aperture;
connections electrically coupling the terminals of the package with the first and second microelectronic elements, the connections including groups of connections for carrying respective signals, each group including a first connection extending from a respective terminal of the package to a corresponding contact on the first microelectronic element and a second connection extending from the respective terminal to a corresponding contact on the second microelectronic element, the first and second connections being configured such that a respective signal carried by the first and second connections in each group is subject to propagation delay of the same duration between the respective terminal and each of the corresponding contacts coupled thereto,
wherein the substrate has a central region bounded at least partly by the first and second apertures, the terminals comprise first terminals disposed in the central region, the first connections include leads having portions aligned with the first aperture, and the second connections include leads having portions aligned with the second aperture.

15. The microelectronic package as claimed in claim 14, wherein the first leads comprise wire bonds extending through the first aperture and not extending through the second aperture, and the second leads comprise wire bonds extending through the second aperture and not extending through the first aperture.

16. The microelectronic package as claimed in claim 14, wherein the face of the second microelectronic element has first and second peripheral regions adjacent to first and second opposed peripheral edges of the second microelectronic element, respectively and the contacts of the second microelectronic element are disposed in a central region of the face of the second microelectronic element between the first and second peripheral regions, the central region and the first and second peripheral regions having equal width in a direction between the first and second peripheral edges, such that the central region occupies a middle third of a shortest distance between the first and second peripheral edges.

17. The microelectronic package as claimed in claim 16, wherein the face of the first microelectronic element has first and second peripheral regions adjacent to first and second opposed peripheral edges of the first microelectronic element, respectively, and the contacts of the first microelectronic element are disposed in a central region of the face of the first microelectronic element between the first and second peripheral regions of the first microelectronic element, the central region and the first and second peripheral regions of the first microelectronic element having equal width in a direction between the first and second peripheral edges of the first microelectronic element, such that the central region of the first microelectronic element occupies a middle third of a shortest distance between the first and second peripheral edges of the first microelectronic element.

18. The microelectronic package as claimed in claim 17, wherein each of the first and second microelectronic elements comprises a semiconductor chip implemented in a dynamic random access memory ("DRAM") technology.

19. The microelectronic package as claimed in claim 14, wherein a difference between the total electrical lengths of the connections in a respective group of the connections is not greater than 10 percent, even when distances along straight lines between the terminal and the respective contacts coupled by such group of connections varies by greater than 10%.

20. The microelectronic package as claimed in claim 14, wherein the same duration of the propagation delay of the respective signal on the first and second connections within each group is within a tolerance of ten percent of the cycle time of that signal.

* * * * *